(12) United States Patent
Huang et al.

(10) Patent No.: US 10,269,766 B2
(45) Date of Patent: Apr. 23, 2019

(54) REDISTRIBUTION LAYERS IN SEMICONDUCTOR PACKAGES AND METHODS OF FORMING SAME

(71) Applicant: Taiwan Semiconductor Manufacturing Company, Ltd., Hsin-Chu (TW)

(72) Inventors: Li-Hsien Huang, Zhubei (TW); An-Jhih Su, Bade (TW); Chi-Hsi Wu, Hsin-Chu (TW); Chen-Hua Yu, Hsin-Chu (TW); Der-Chyang Yeh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/396,208

(22) Filed: Dec. 30, 2016

(65) Prior Publication Data

US 2018/0122774 A1 May 3, 2018

Related U.S. Application Data

(60) Provisional application No. 62/415,210, filed on Oct. 31, 2016.

(51) Int. Cl.
*H01L 25/065* (2006.01)
*H01L 23/00* (2006.01)
(Continued)

(52) U.S. Cl.
CPC .......... *H01L 25/0655* (2013.01); *H01L 21/56* (2013.01); *H01L 21/561* (2013.01); *H01L 23/3114* (2013.01); *H01L 24/02* (2013.01);

*H01L 24/24* (2013.01); *H01L 25/50* (2013.01); *H01L 21/568* (2013.01);
(Continued)

(58) Field of Classification Search
CPC ... H01L 2224/0235; H01L 2224/02351; H01L 2224/02375; H01L 25/0655; H01L 2224/02372; H01L 2224/24137; H01L 2224/244; H01L 2224/2405; H01L 24/24; H01L 23/5381; H01L 23/5386
See application file for complete search history.

(56) References Cited

U.S. PATENT DOCUMENTS 9,000,584 B2 4/2015 Lin et al.
9,048,222 B2 6/2015 Hung et al.
(Continued)

FOREIGN PATENT DOCUMENTS

KR 20160029621 A 3/2016
KR 20160111297 A 9/2016
(Continued)

*Primary Examiner* — Daniel Luke
(74) *Attorney, Agent, or Firm* — Slater Matsil, LLP

(57) ABSTRACT

An embodiment package includes a first integrated circuit die, an encapsulant around the first integrated circuit die, a conductive line electrically connecting a first conductive via to a second conductive via, the conductive line including a first segment over the first integrated circuit die and having a first width, and a second segment over the first integrated circuit die having a second width larger than the first width, the second segment extending over a first boundary between the first integrated circuit die and the encapsulant.

19 Claims, 24 Drawing Sheets

(51) Int. Cl.
  *H01L 21/56* (2006.01)
  *H01L 23/31* (2006.01)
  *H01L 25/00* (2006.01)
(52) U.S. Cl.
  CPC .. *H01L 23/3128* (2013.01); *H01L 2224/0231* (2013.01); *H01L 2224/04105* (2013.01); *H01L 2224/12105* (2013.01); *H01L 2224/2405* (2013.01); *H01L 2224/24137* (2013.01); *H01L 2224/32225* (2013.01); *H01L 2224/73267* (2013.01); *H01L 2225/06544* (2013.01); *H01L 2225/06548* (2013.01); *H01L 2225/06582* (2013.01)

(56) References Cited

U.S. PATENT DOCUMENTS

| | | | |
|---|---|---|---|
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu |
| 9,496,189 | B2 | 11/2016 | Yu et al. |
| 9,899,287 | B2 * | 2/2018 | Su ................ H01L 23/3128 |
| 2011/0248399 | A1 | 10/2011 | Pendse |
| 2013/0221509 | A1 | 8/2013 | Oda et al. |
| 2014/0124941 | A1 | 5/2014 | Sakamoto |
| 2015/0279776 | A1 | 10/2015 | Hu et al. |
| 2016/0071820 | A1 | 3/2016 | Yu et al. |
| 2016/0276248 | A1 | 9/2016 | Huang et al. |

FOREIGN PATENT DOCUMENTS

| | | |
|---|---|---|
| TW | 201225210 A | 6/2012 |
| TW | 201227901 A | 7/2012 |
| TW | 201234680 A | 8/2012 |
| WO | 2013057867 A1 | 4/2013 |

* cited by examiner

US 10,269,766 B2

REDISTRIBUTION LAYERS IN SEMICONDUCTOR PACKAGES AND METHODS OF FORMING SAME

PRIORITY CLAIM

This application claims the benefit of U.S. Provisional Application No. 62/415,210, entitled "Redistribution Layers in Semiconductor Packages and Methods of Forming Same," filed on Oct. 31, 2016, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
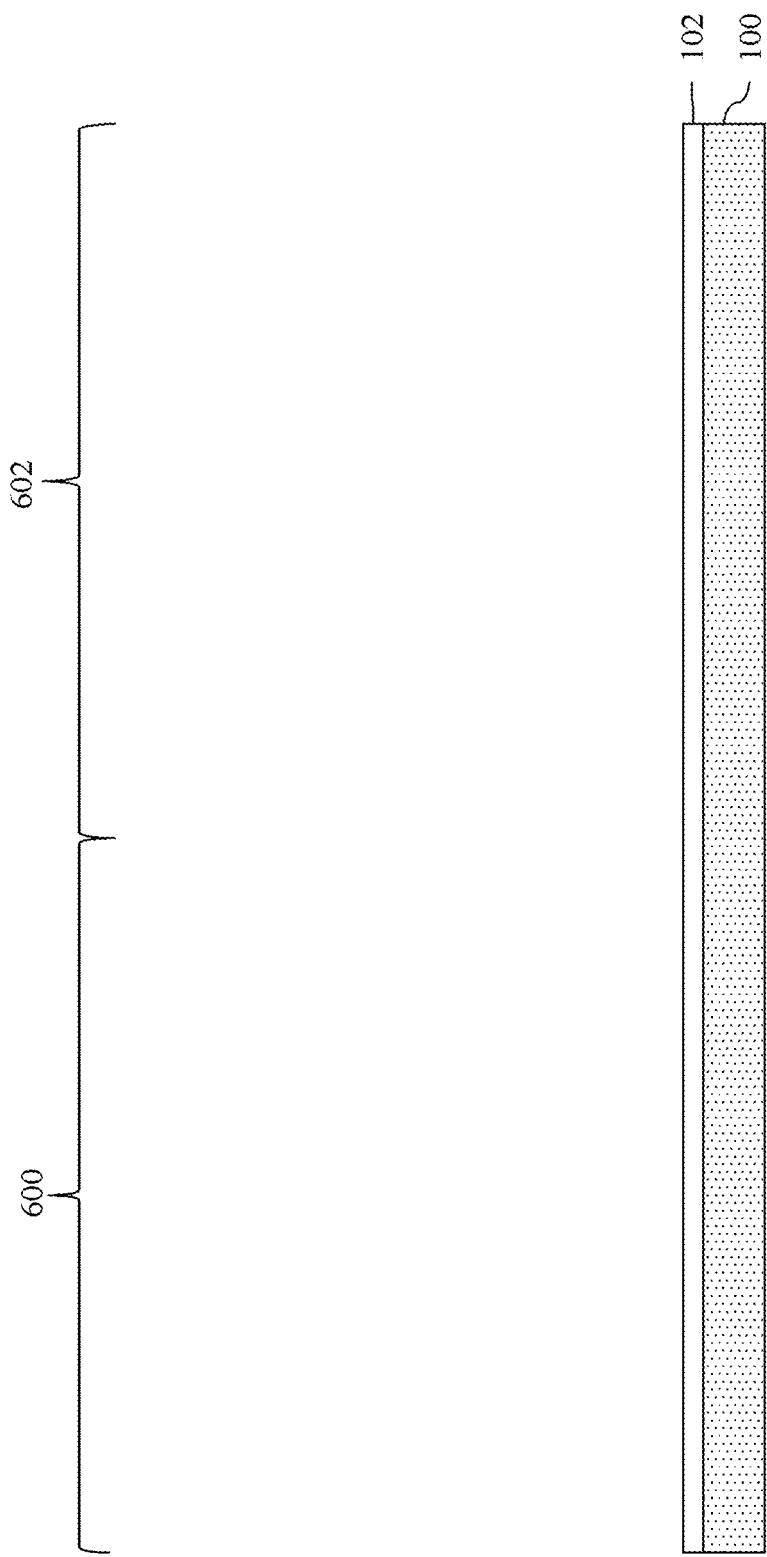
FIGS. 1 through 15 illustrate cross-sectional views of intermediate steps during a process for forming a first package structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure including a redistribution layer (RDL) routing design that enables more reliability robustness at a semiconductor-encapsulant boundary (e.g. a silicon/molding compound (Si/MC) boundary). The package structures may include a fan-out package or fan-in package and may include one or more RDLs. For example, heating a package up in wafer form from room temperature to 220° Celsius (C.) results in high bending stresses on the RDL at the semiconductor-encapsulant boundary due to the curvature changing because of coefficient of thermal expansion (CTE) mismatch. The semiconductor may be a die/chip. The stress of transferring across such a boundary can cause RDL cracking. Hence, in some embodiments, the RDL routing design can be configured in accordance with this CTE mismatch and be used for improved reliability robustness and fewer manufacturing defects. In some embodiments, the RDLs traversing and within a predetermined distance of the semiconductor-encapsulant boundary can be made to be wider than normal RDLs so that they are less likely to crack. Moreover, the RDLs can be normal width outside of the boundary and predetermined distance from the boundary such that there is no routing penalty for the wider traces of the RDL.

Further, the teachings of this disclosure are applicable to any package structure including one or conductive layers that traverse over different materials that have different CTE. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 15 illustrate cross-sectional views of intermediate steps during a process for forming a first package structure in accordance with some embodiments. FIG. 1 illustrates a carrier substrate 100 and a release layer 102 formed on the carrier substrate 100. A first package region 600 and a second package region 602 for the formation of a first package and a second package, respectively, are illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

Figure 2:
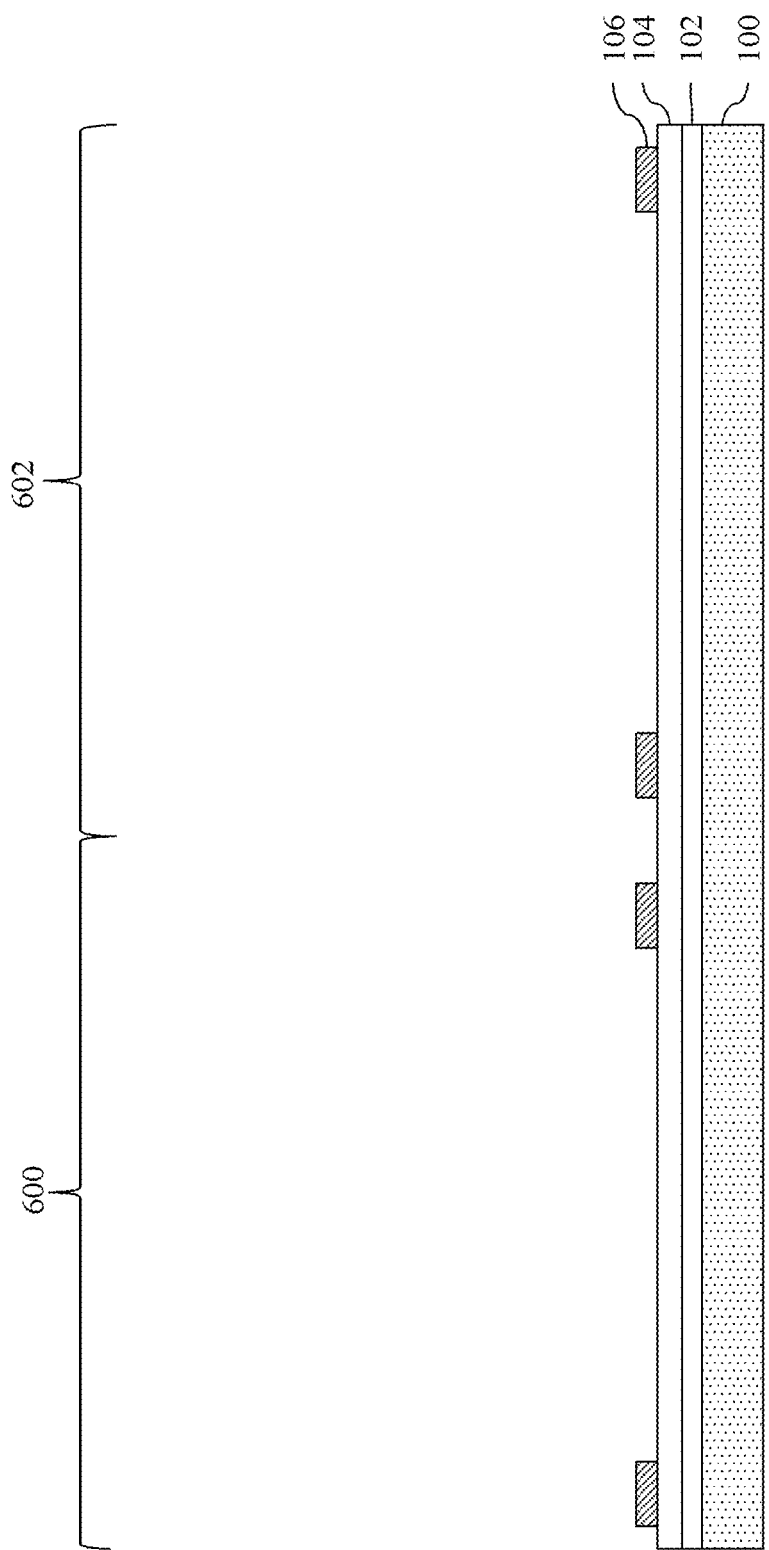

In FIG. 2, a dielectric layer 104 and a metallization pattern 106 are formed. As illustrated in FIG. 2, a dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

Figure 3:
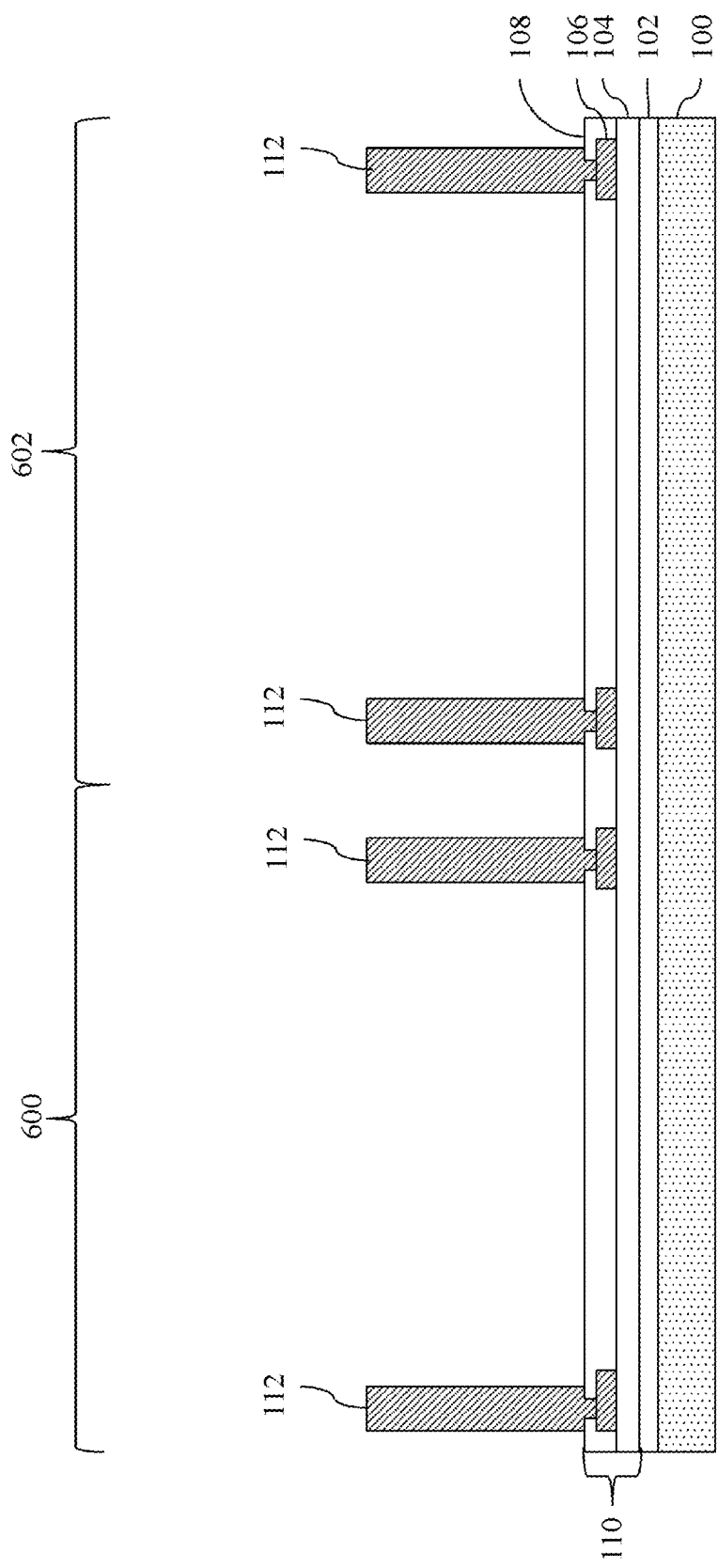

In FIG. 3, a dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization patterns 106 may be referred to as a back-side redistribution structure 110. As illustrated, the back-side redistribution structure 110 includes the two dielectric layers 104 and 108 and one metallization pattern 106. In other embodiments, the back-side redistribution structure 110 can include any number of dielectric layers, metallization patterns, and vias. One or more additional metallization pattern and dielectric layer may be formed in the back-side redistribution structure 110 by repeating the processes for forming a metallization patterns 106 and dielectric layer 108. Vias may be formed during the formation of a metallization pattern by forming the seed layer and conductive material of the metallization pattern in the opening of the underlying dielectric layer. The vias may therefore interconnect and electrically couple the various metallization patterns.

Further in FIG. 3, through vias 112 are formed. As an example to form the through vias 112, a seed layer is formed over the back-side redistribution structure 110, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112.

Figure 4:
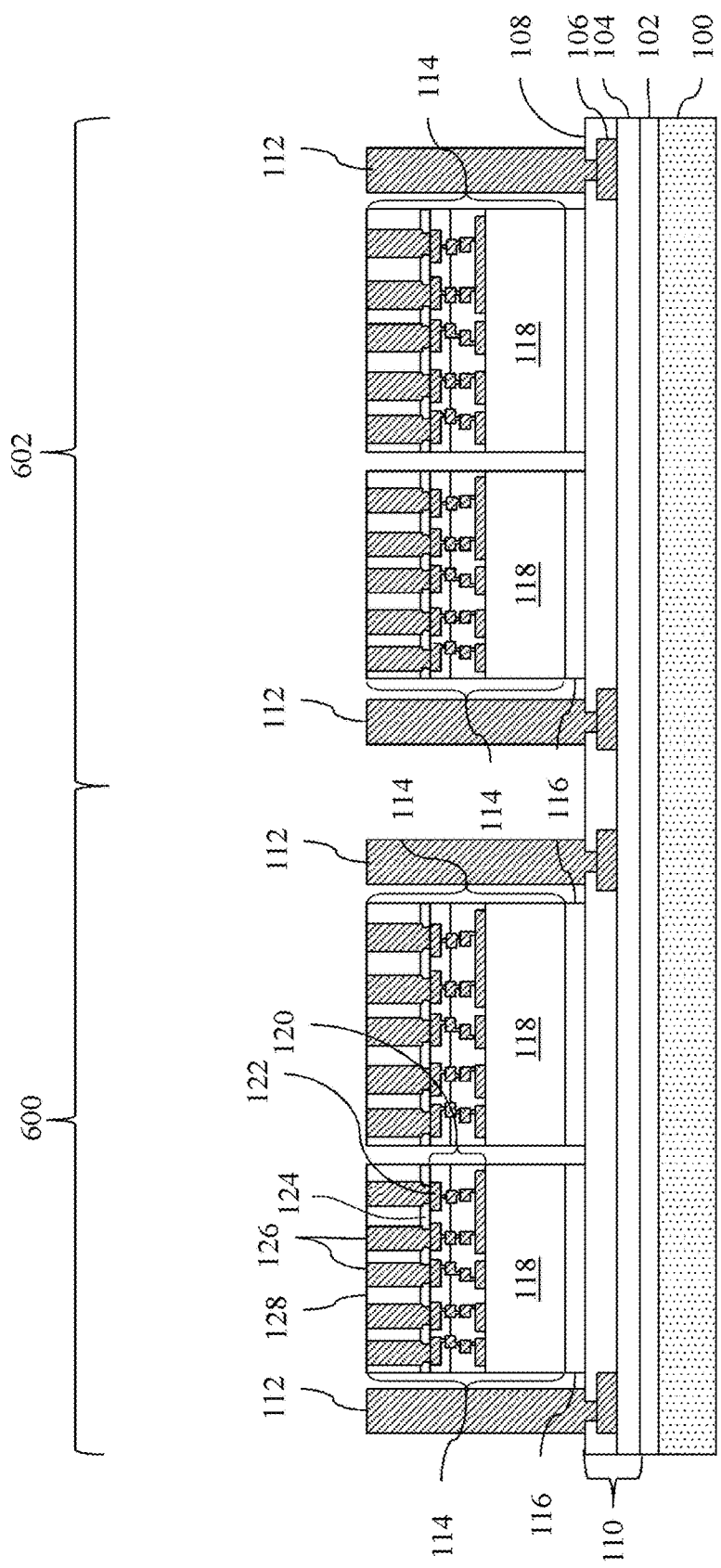

In FIG. 4, integrated circuit dies 114 are adhered to the dielectric layer 108 by an adhesive 116. As illustrated in FIG. 4, two integrated circuit dies 114 are adhered in each of the first package region 600 and the second package region 602, and in other embodiments, more or less integrated circuit dies 114 may be adhered in each region. For example, in an embodiment, only one integrated circuit die 114 may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the dielectric layer 108, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through passivation films 124 and are mechanically and electrically coupled to the respective pads 122. The die connectors 126 may be formed by, for example, plating, or the like. The die connectors 126 electrically couple the respective integrated circuits of the integrate circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Adhesive 116 is on back-sides of the integrated circuit dies 114 and adheres the integrated circuit dies 114 to the back-side redistribution structure 110, such as the dielectric layer 108 in the illustration. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

Figure 5:
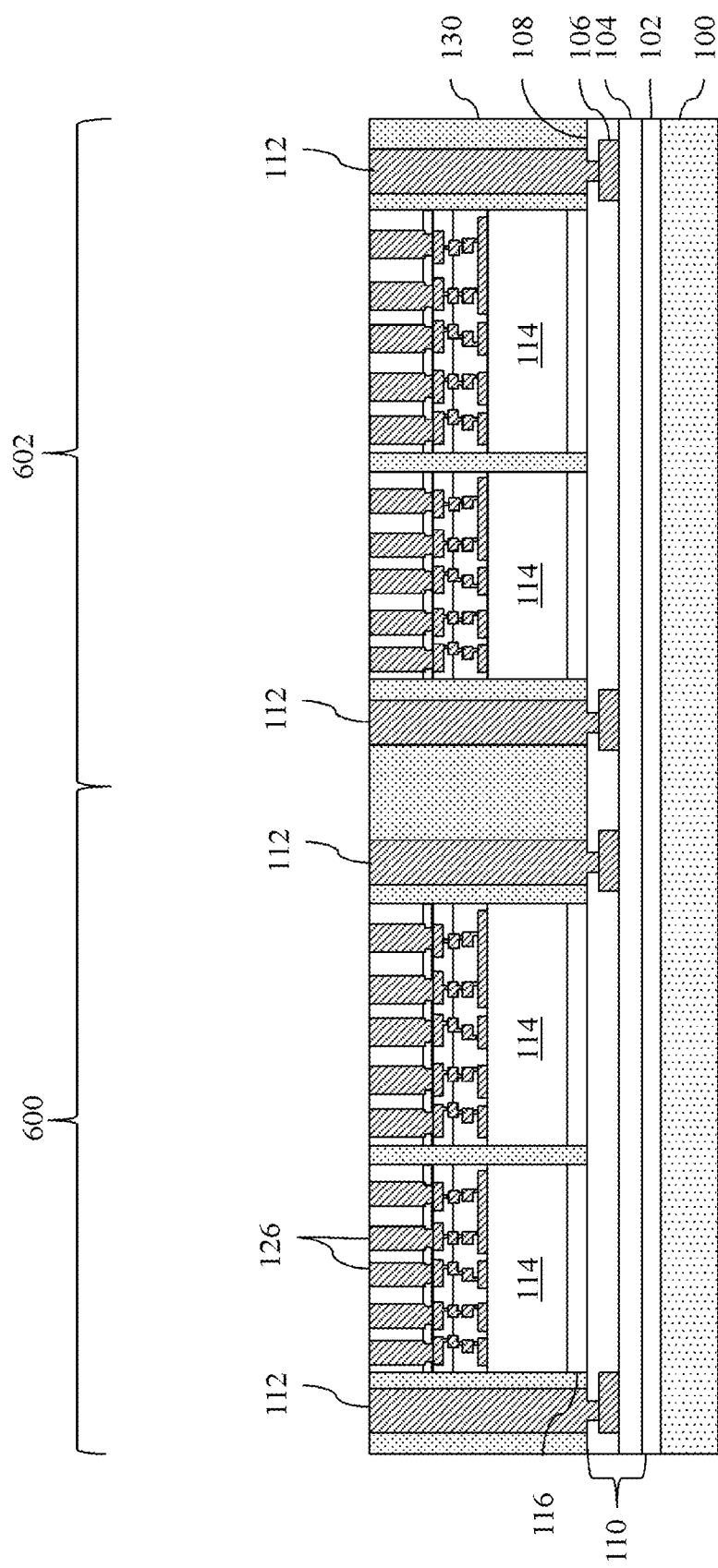

In FIG. 5, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the through vias 112 and die connectors 126. Top surfaces of the through vias 112, die connectors 126, and encapsulant 130 are coplanar after the grinding process. In some embodiments, the grinding may be omitted, for example, if through vias 112 and die connectors 126 are already exposed.

In FIGS. 6 through 15 and 19, a front-side redistribution structure 160 is formed. As will be illustrated in FIG. 19, the front-side redistribution structure 160 includes dielectric layers 132, 140, 148, and 156 and metallization patterns 138, 146, and 154.

Figure 6:
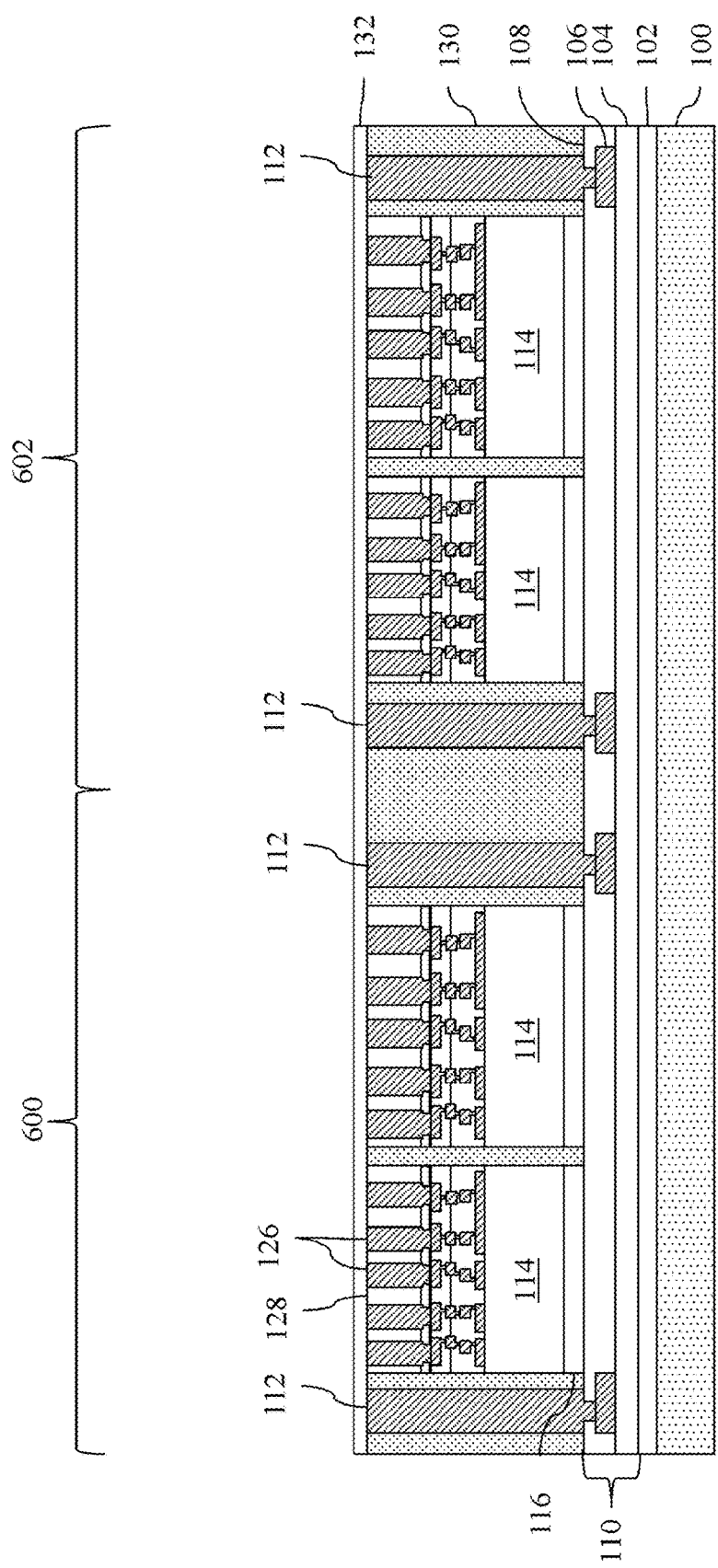

In FIG. 6, the dielectric layer 132 is deposited on the encapsulant 130, through vias 112, and die connectors 126. In some embodiments, the dielectric layer 132 is formed of a polymer, which may be a photo-sensitive material such as PBO, polyimide, BCB, or the like, that may be patterned using a lithography mask. In other embodiments, the dielectric layer 132 is formed of a nitride such as silicon nitride; an oxide such as silicon oxide, PSG, BSG, BPSG; or the like. The dielectric layer 132 may be formed by spin coating, lamination, CVD, the like, or a combination thereof.

Figure 7:
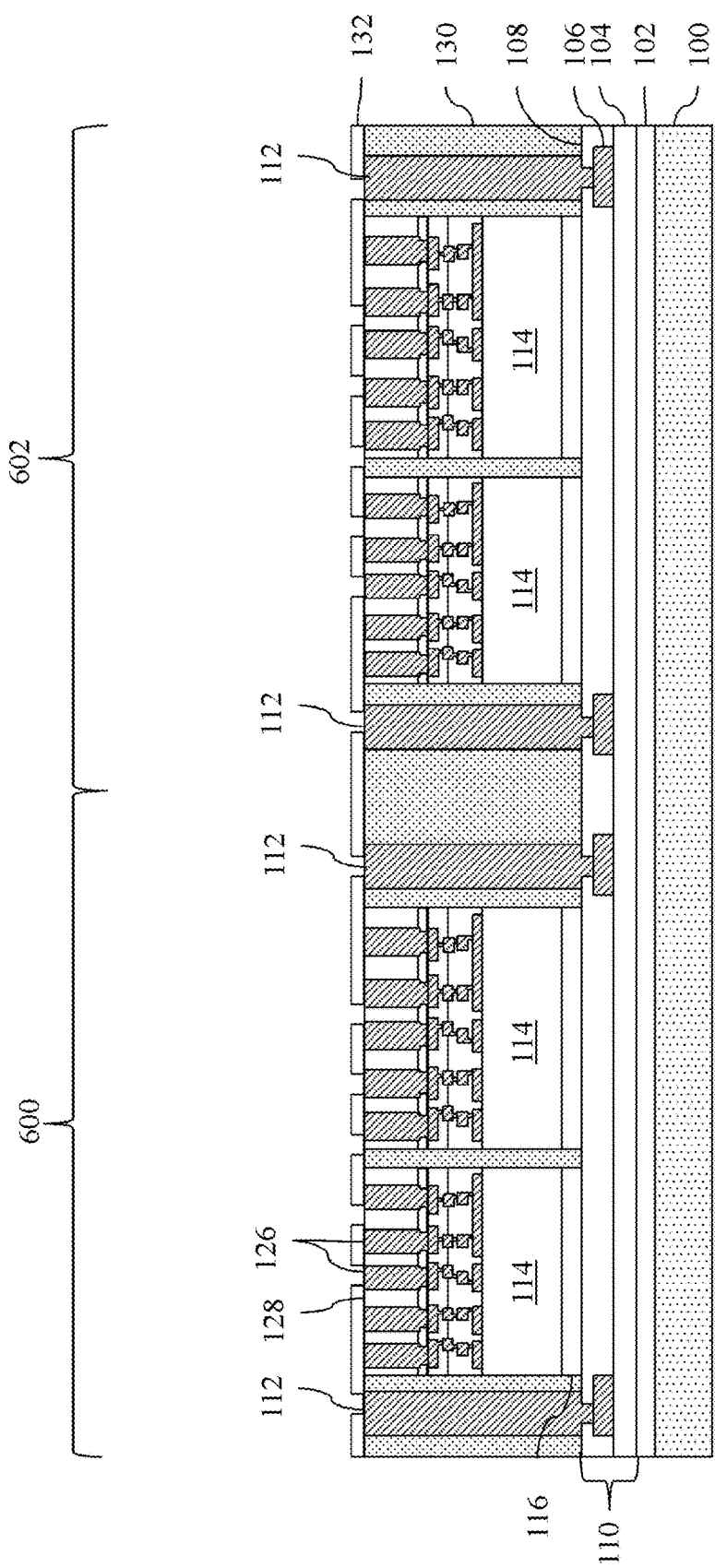

In FIG. 7, the dielectric layer 132 is then patterned. The patterning forms openings to expose portions of the through vias 112 and the die connectors 126. The patterning may be by an acceptable process, such as by exposing the dielectric layer 132 to light when the dielectric layer 132 is a photo-sensitive material or by etching using, for example, an anisotropic etch. If the dielectric layer 132 is a photo-sensitive material, the dielectric layer 132 can be developed after the exposure.

Figure 8:
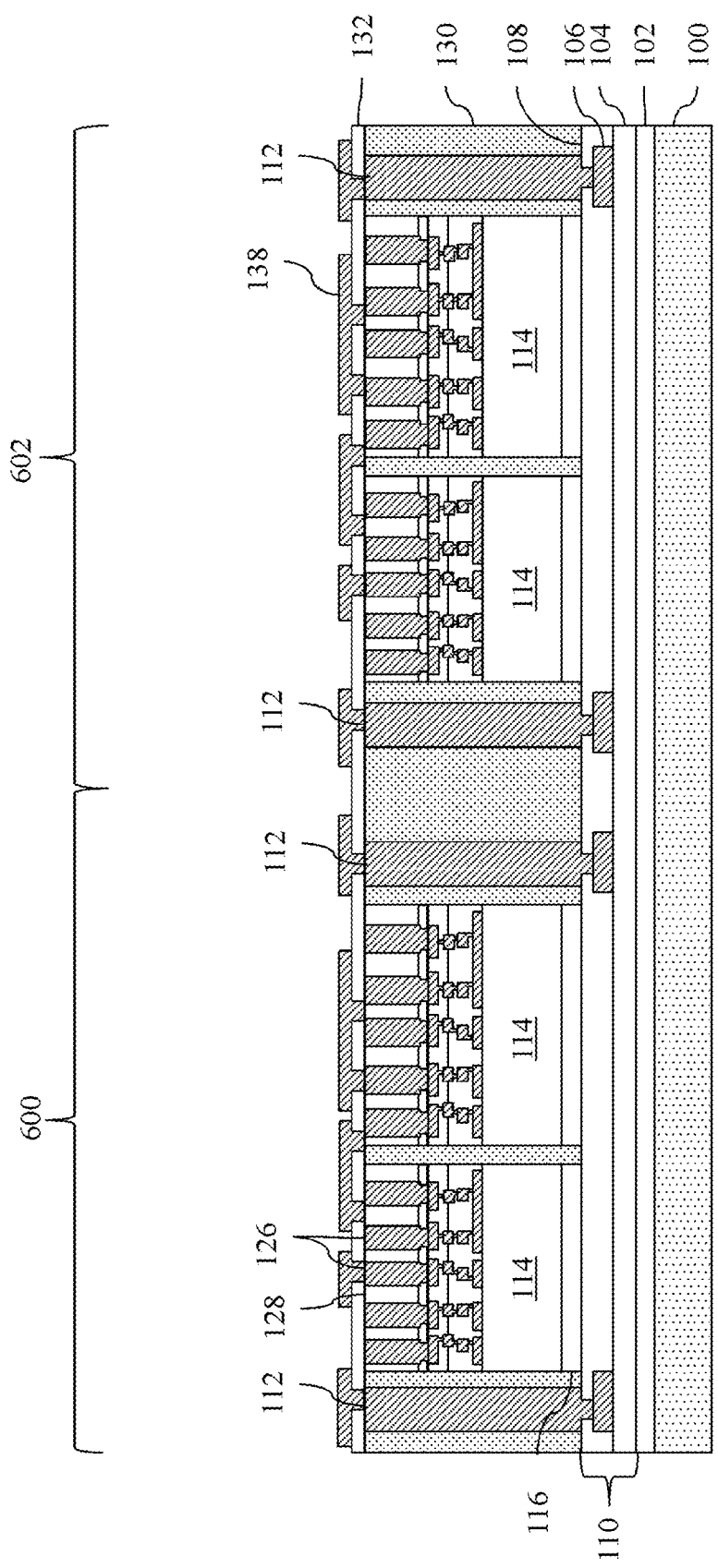

In FIG. 8, metallization pattern 138 with vias is formed on the dielectric layer 132. As an example to form metallization pattern 138, a seed layer (not shown) is formed over the dielectric layer 132 and in openings through the dielectric layer 132. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 132 to, e.g., the through vias 112 and/or the die connectors 126.

Figure 9:
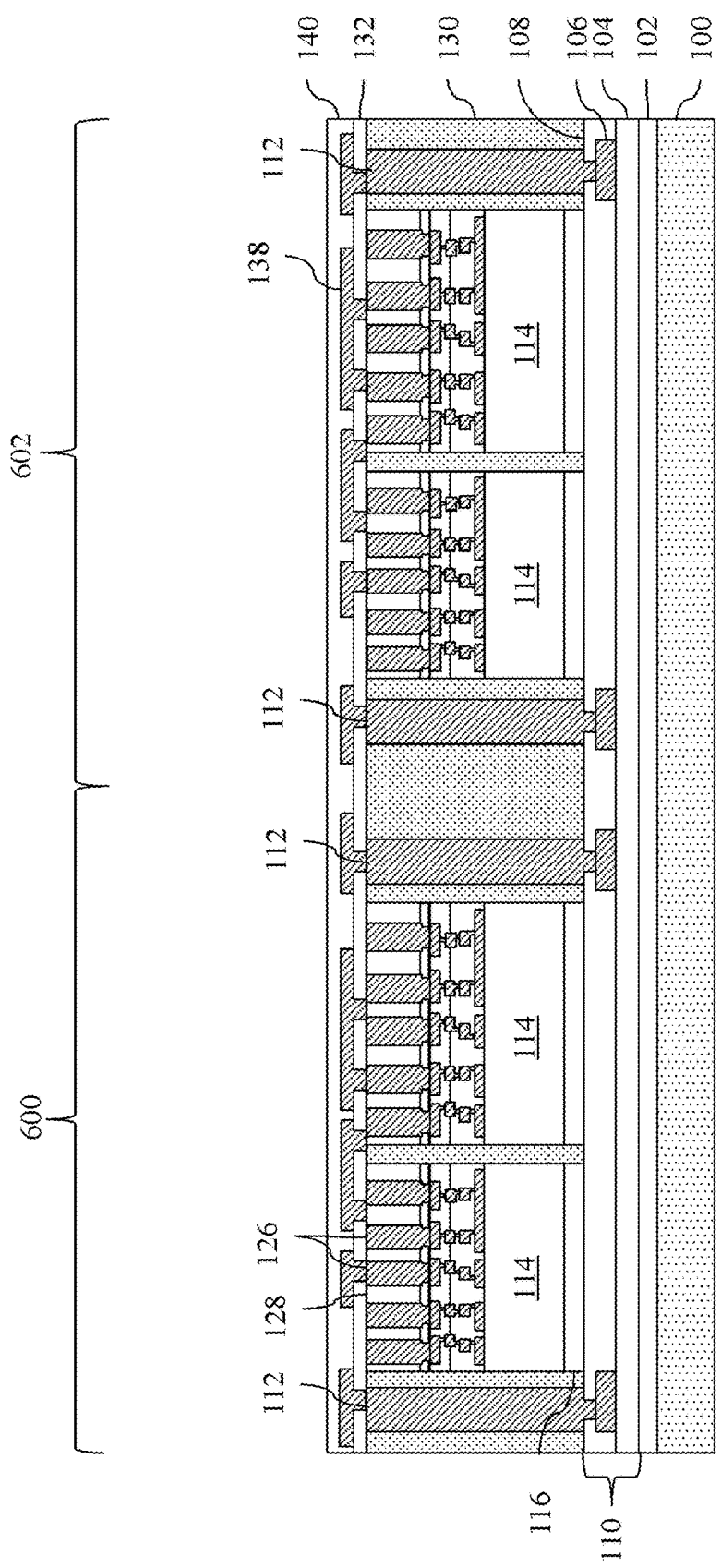

In FIG. 9, the dielectric layer 140 is deposited on the metallization pattern 138 and the dielectric layer 132. In some embodiments, the dielectric layer 140 is formed of a polymer, which may be a photo-sensitive material such as PBO, polyimide, BCB, or the like, that may be patterned using a lithography mask. In other embodiments, the dielectric layer 140 is formed of a nitride such as silicon nitride; an oxide such as silicon oxide, PSG, BSG, BPSG; or the like. The dielectric layer 140 may be formed by spin coating, lamination, CVD, the like, or a combination thereof.

Figure 10:
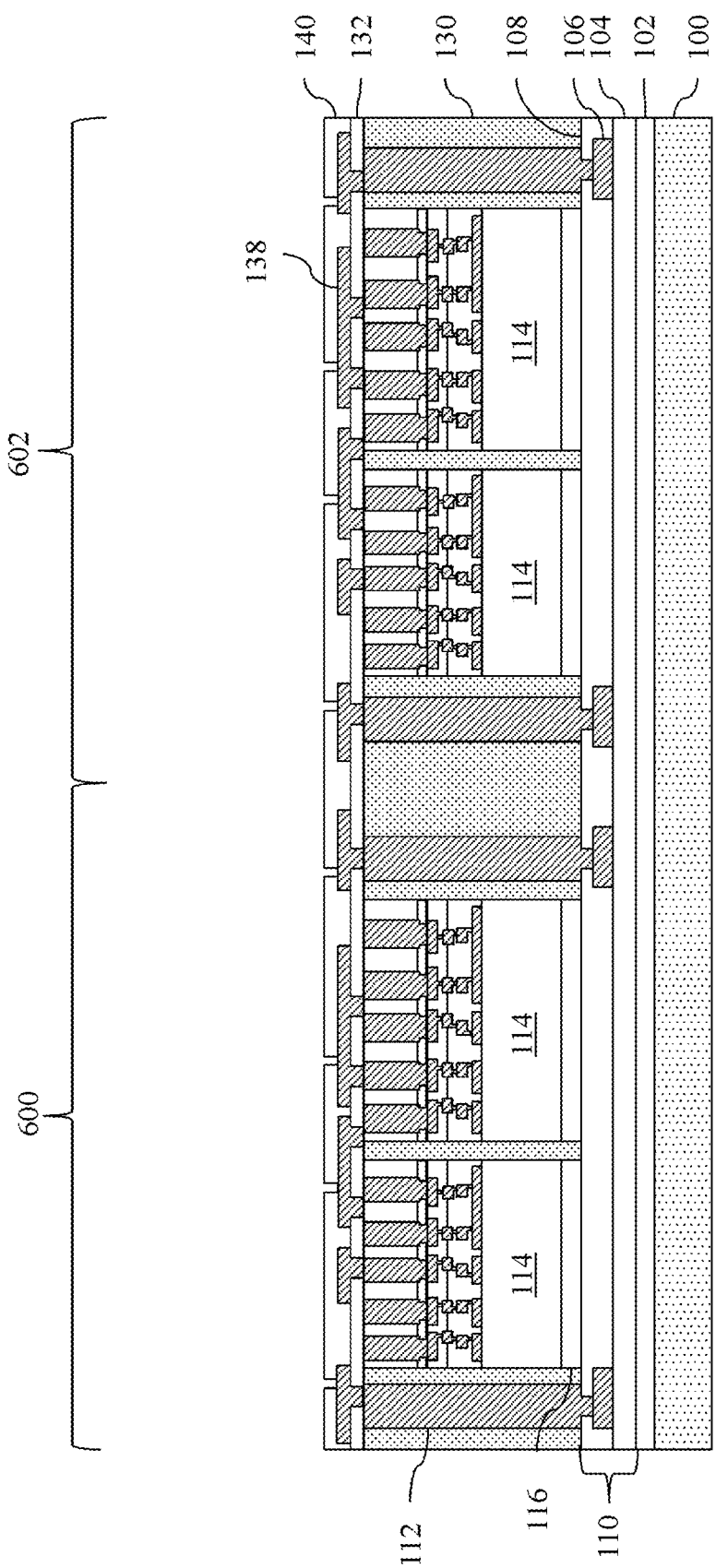

In FIG. 10, the dielectric layer 140 is then patterned. The patterning forms openings to expose portions of the metallization pattern 138. The patterning may be by an acceptable process, such as by exposing the dielectric layer 140 to light when the dielectric layer is a photo-sensitive material or by etching using, for example, an anisotropic etch. If the dielectric layer 140 is a photo-sensitive material, the dielectric layer 140 can be developed after the exposure.

Figure 11:
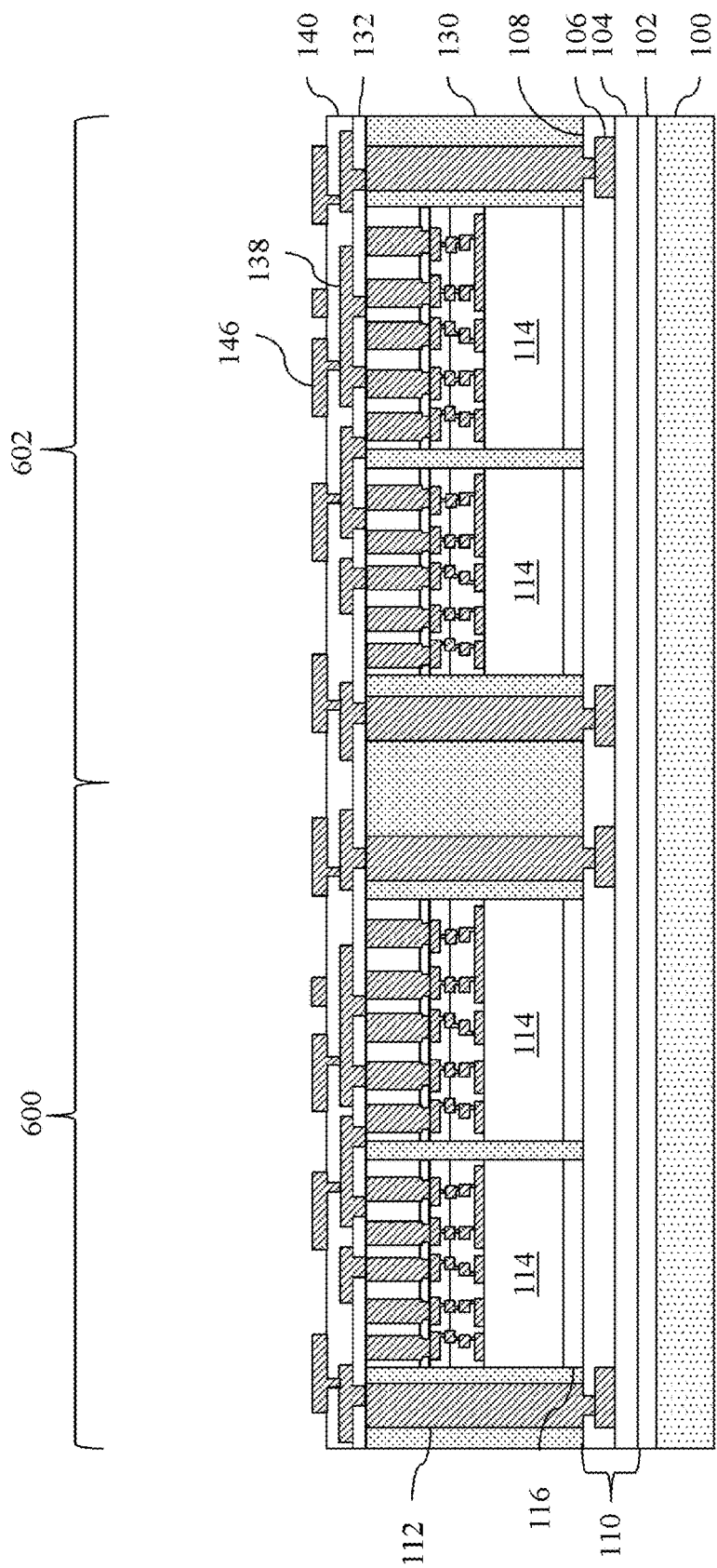

In FIG. 11, metallization pattern 146 with vias is formed on the dielectric layer 140. As an example to form metallization pattern 146, a seed layer (not shown) is formed over the dielectric layer 140 and in openings through the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 146. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 146 and vias. The vias are formed in openings through the dielectric layer 140 to, e.g., portions of the metallization pattern 138.

Figure 12:
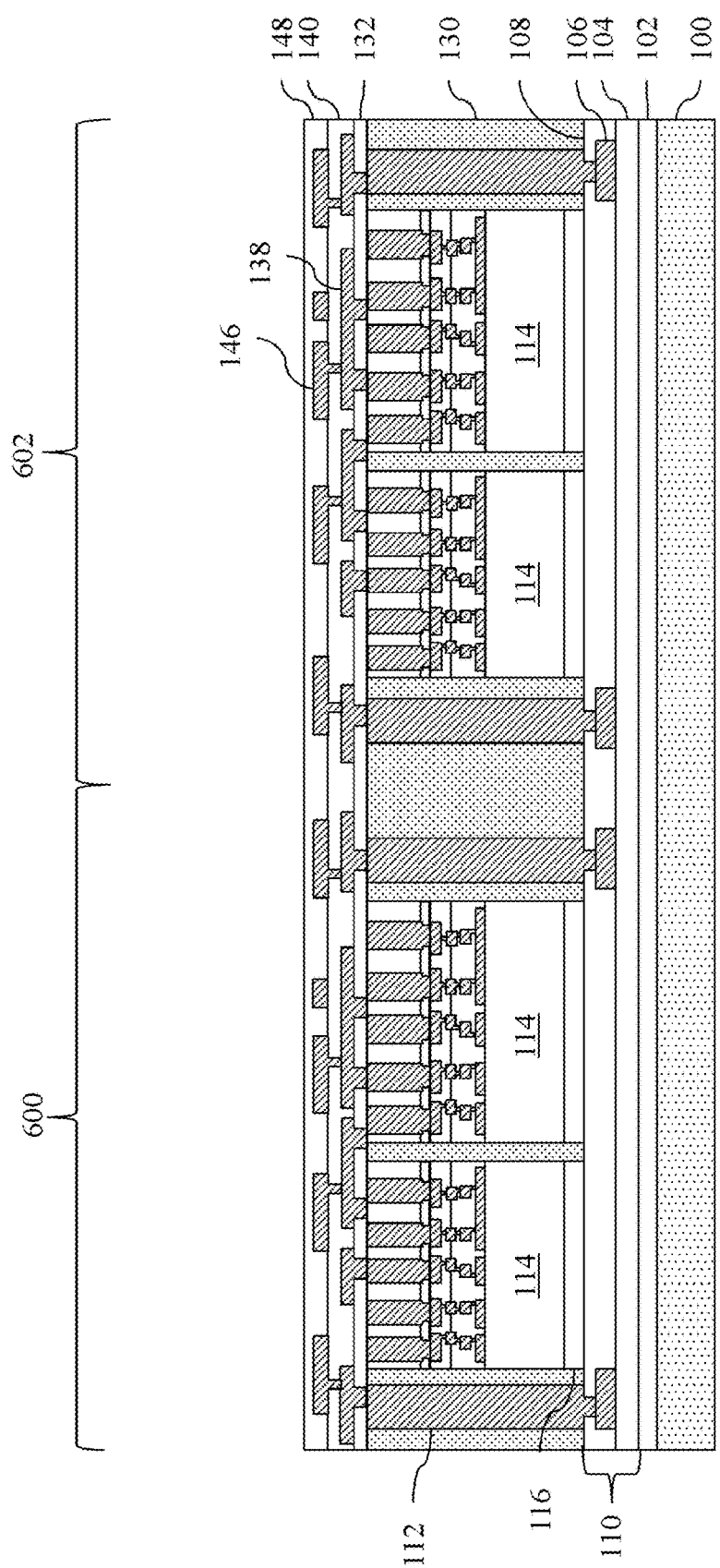

In FIG. 12, the dielectric layer 148 is deposited on the metallization pattern 146 and the dielectric layer 140. In some embodiments, the dielectric layer 148 is formed of a polymer, which may be a photo-sensitive material such as PBO, polyimide, BCB, or the like, that may be patterned using a lithography mask. In other embodiments, the dielectric layer 148 is formed of a nitride such as silicon nitride; an oxide such as silicon oxide, PSG, BSG, BPSG; or the like. The dielectric layer 148 may be formed by spin coating, lamination, CVD, the like, or a combination thereof.

Figure 13:
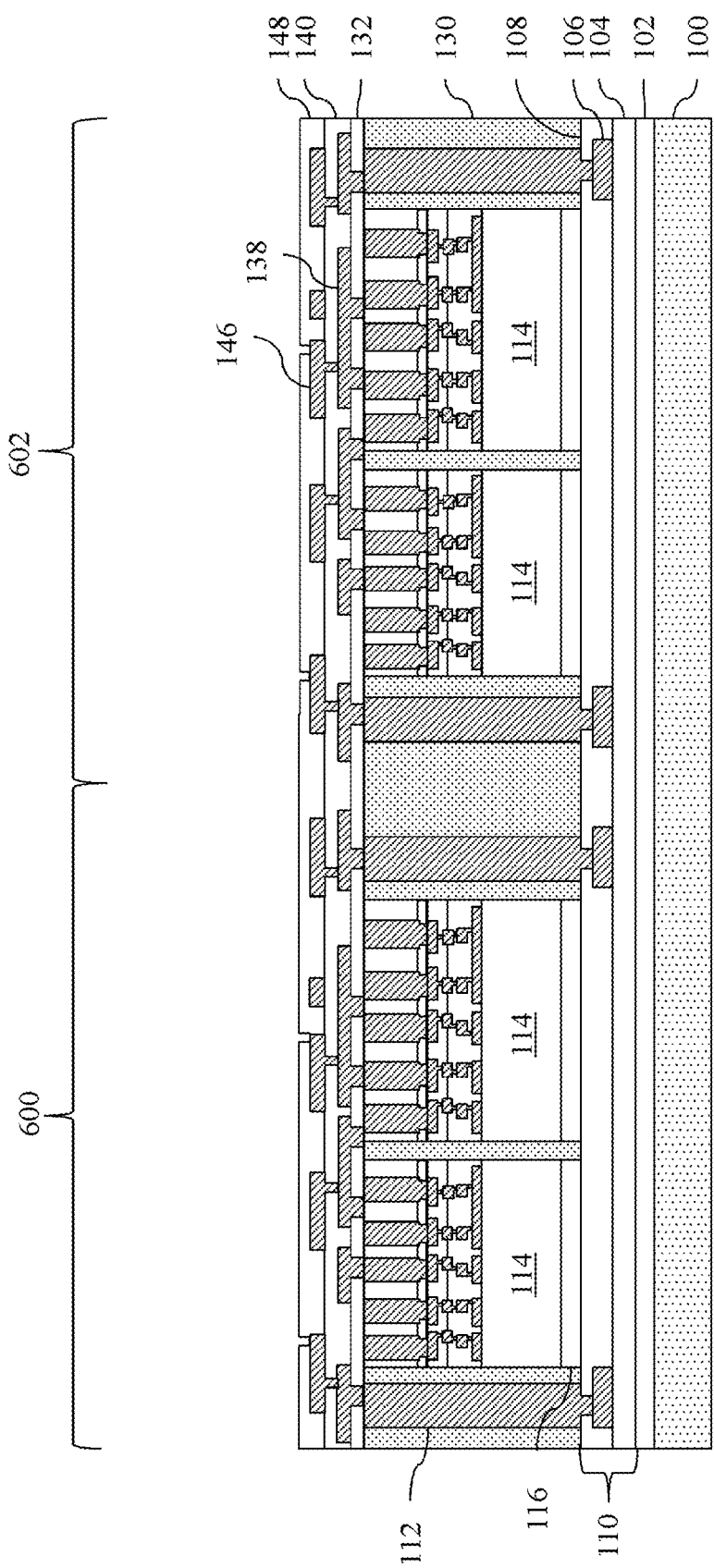

In FIG. 13, the dielectric layer 148 is then patterned. The patterning forms openings to expose portions of the metallization pattern 146. The patterning may be by an acceptable process, such as by exposing the dielectric layer 148 to light when the dielectric layer is a photo-sensitive material or by etching using, for example, an anisotropic etch. If the dielectric layer 148 is a photo-sensitive material, the dielectric layer 148 can be developed after the exposure.

Figure 14:
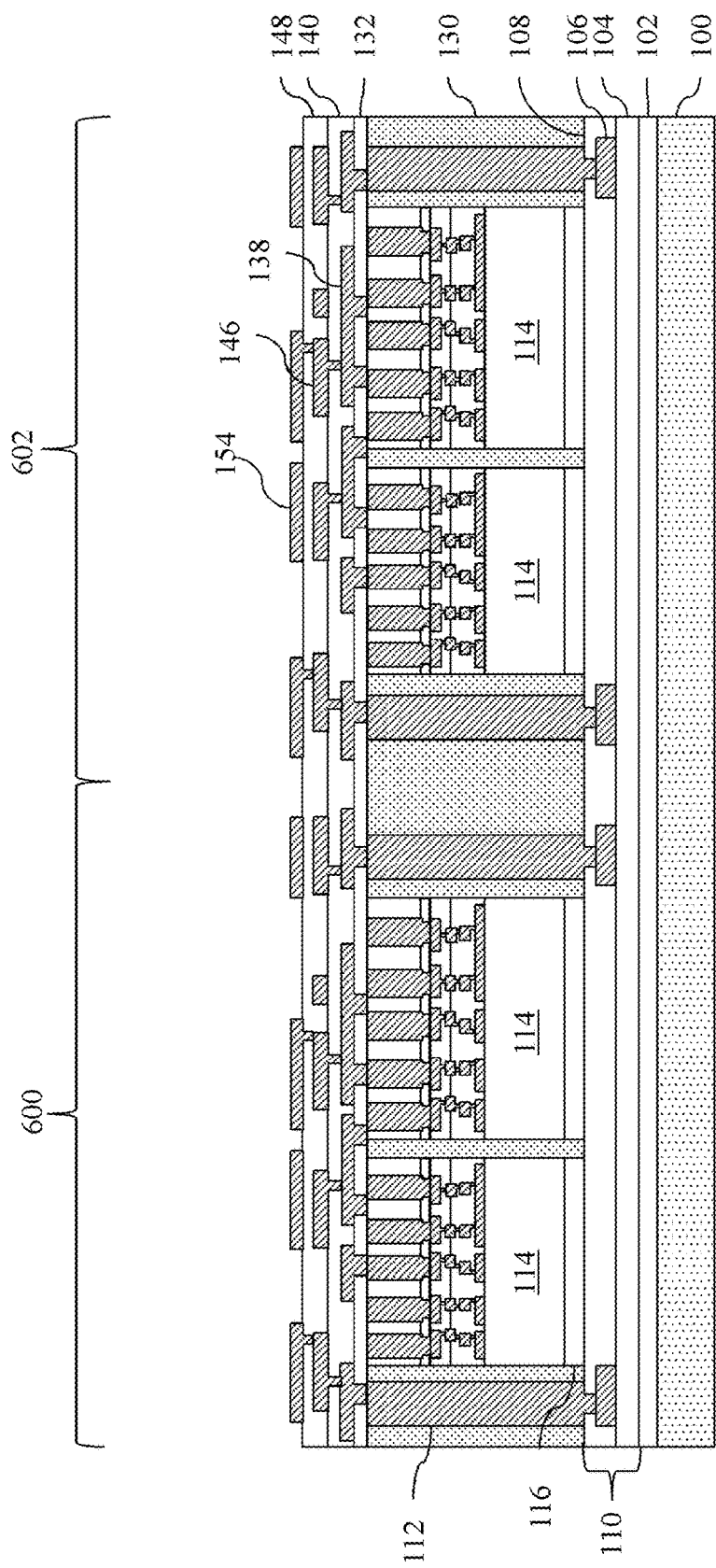

In FIG. 14, metallization pattern 154 with vias is formed on the dielectric layer 148. As an example to form metallization pattern 154, a seed layer (not shown) is formed over the dielectric layer 148 and in openings through the dielectric layer 148. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 154. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 154 and vias. The vias are formed in openings through the dielectric layer 148 to, e.g., portions of the metallization pattern 146.

Figure 15:
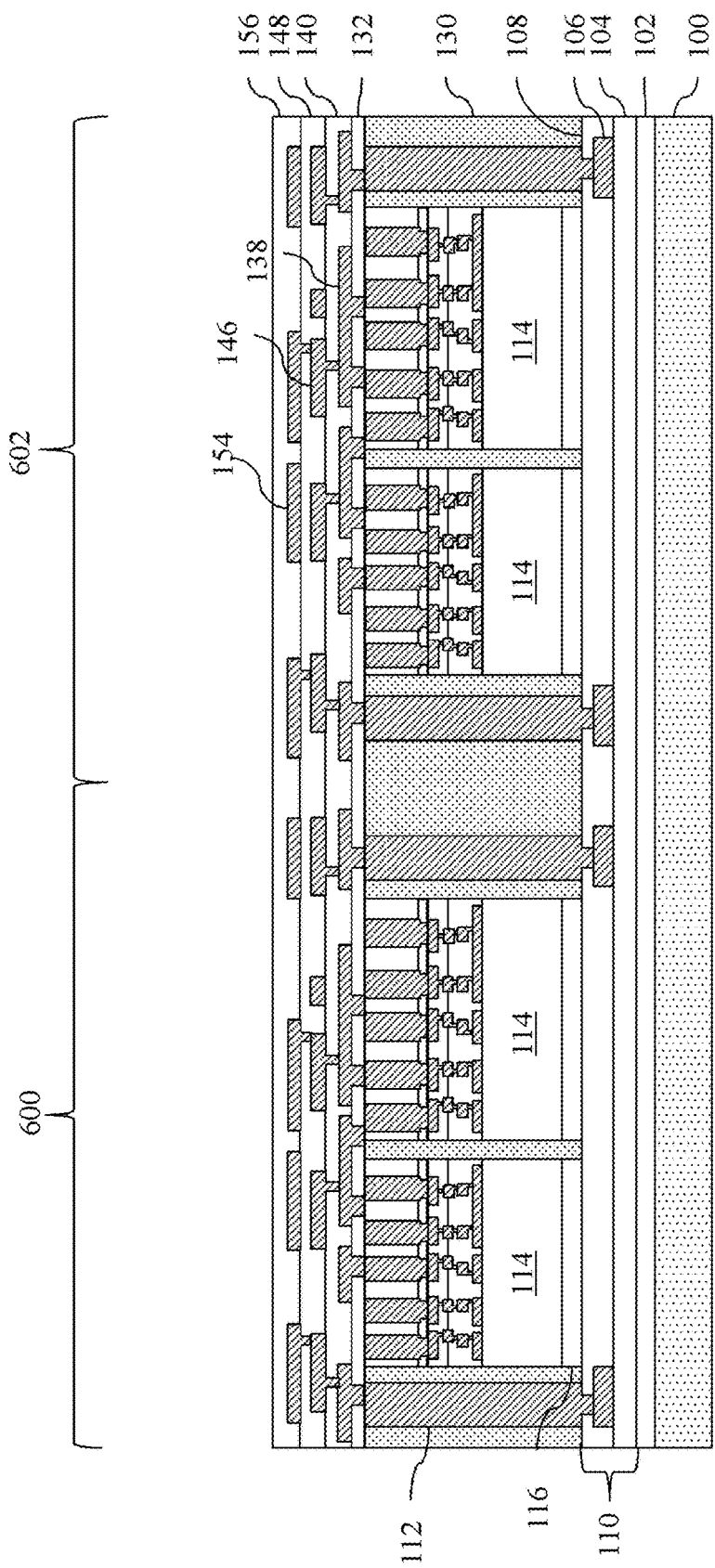

In FIG. 15, the dielectric layer 156 is deposited on the metallization pattern 154 and the dielectric layer 148. In some embodiments, the dielectric layer 156 is formed of a polymer, which may be a photo-sensitive material such as PBO, polyimide, BCB, or the like, that may be patterned using a lithography mask. In other embodiments, the dielectric layer 156 is formed of a nitride such as silicon nitride; an oxide such as silicon oxide, PSG, BSG, BPSG; or the like. The dielectric layer 156 may be formed by spin coating, lamination, CVD, the like, or a combination thereof.

Figure 16:
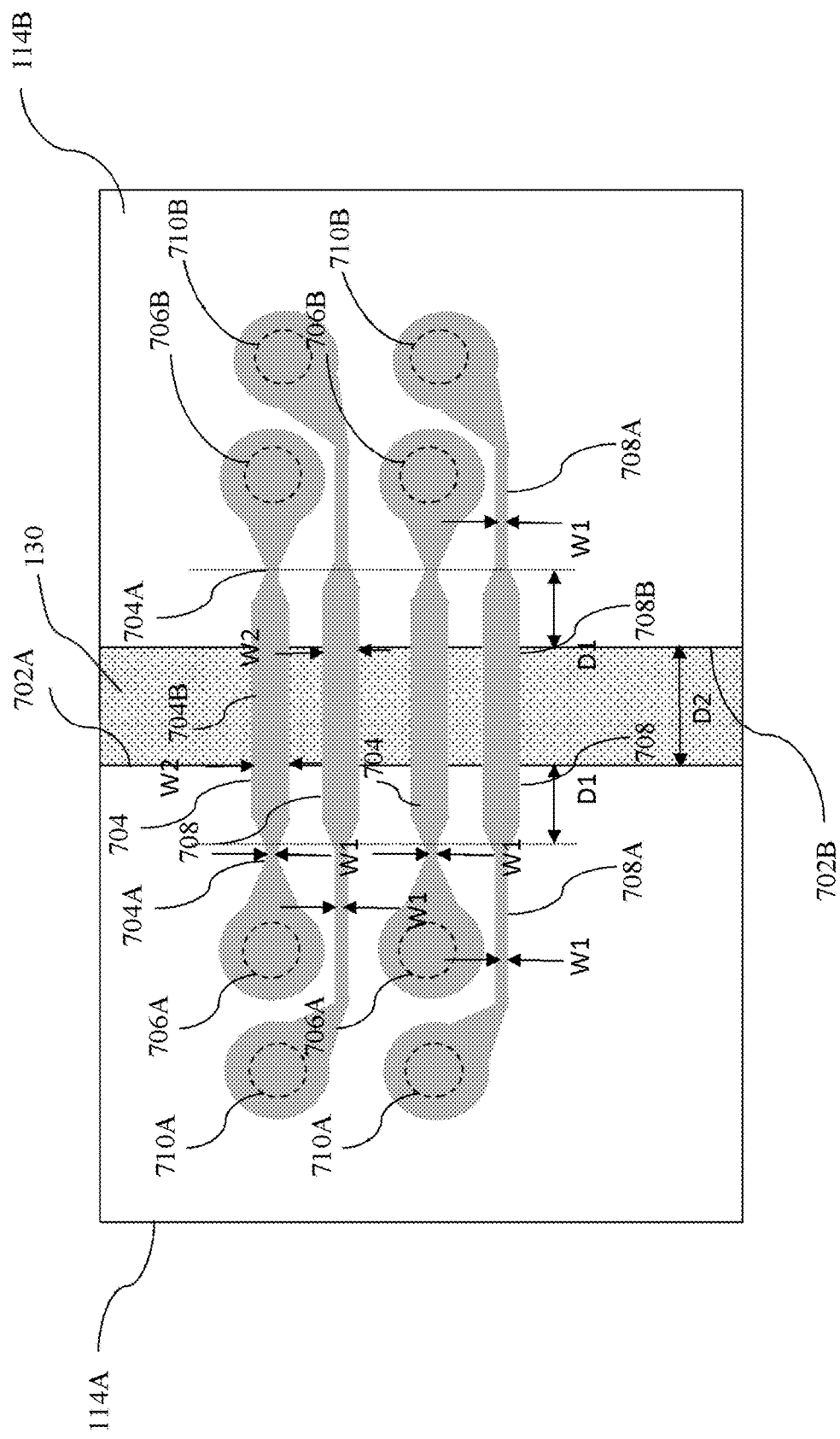
FIGS. 16 through 18 illustrate plan views of a conductive layer routing in accordance with some embodiments.
Figure 17:
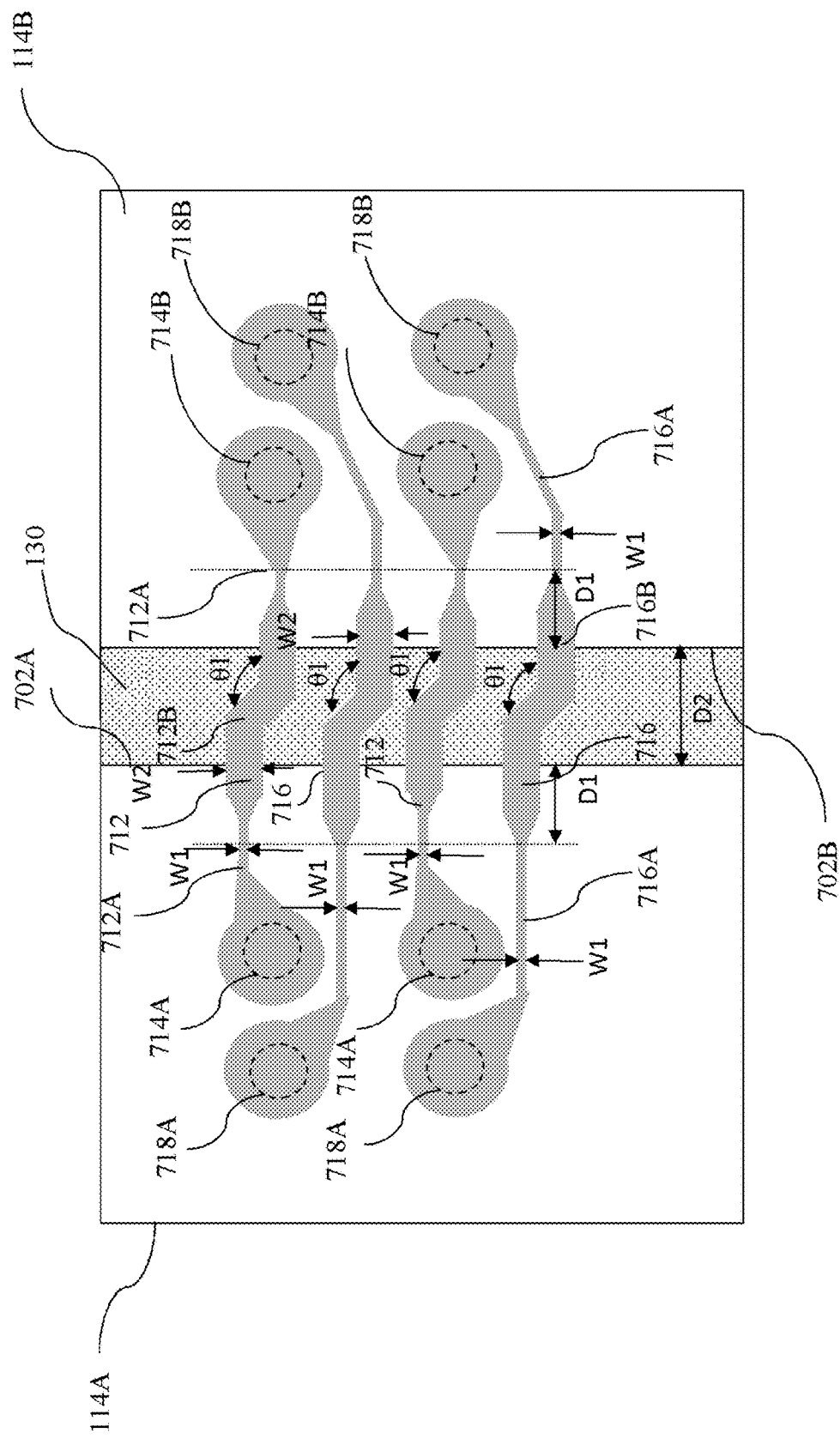
Figure 18:
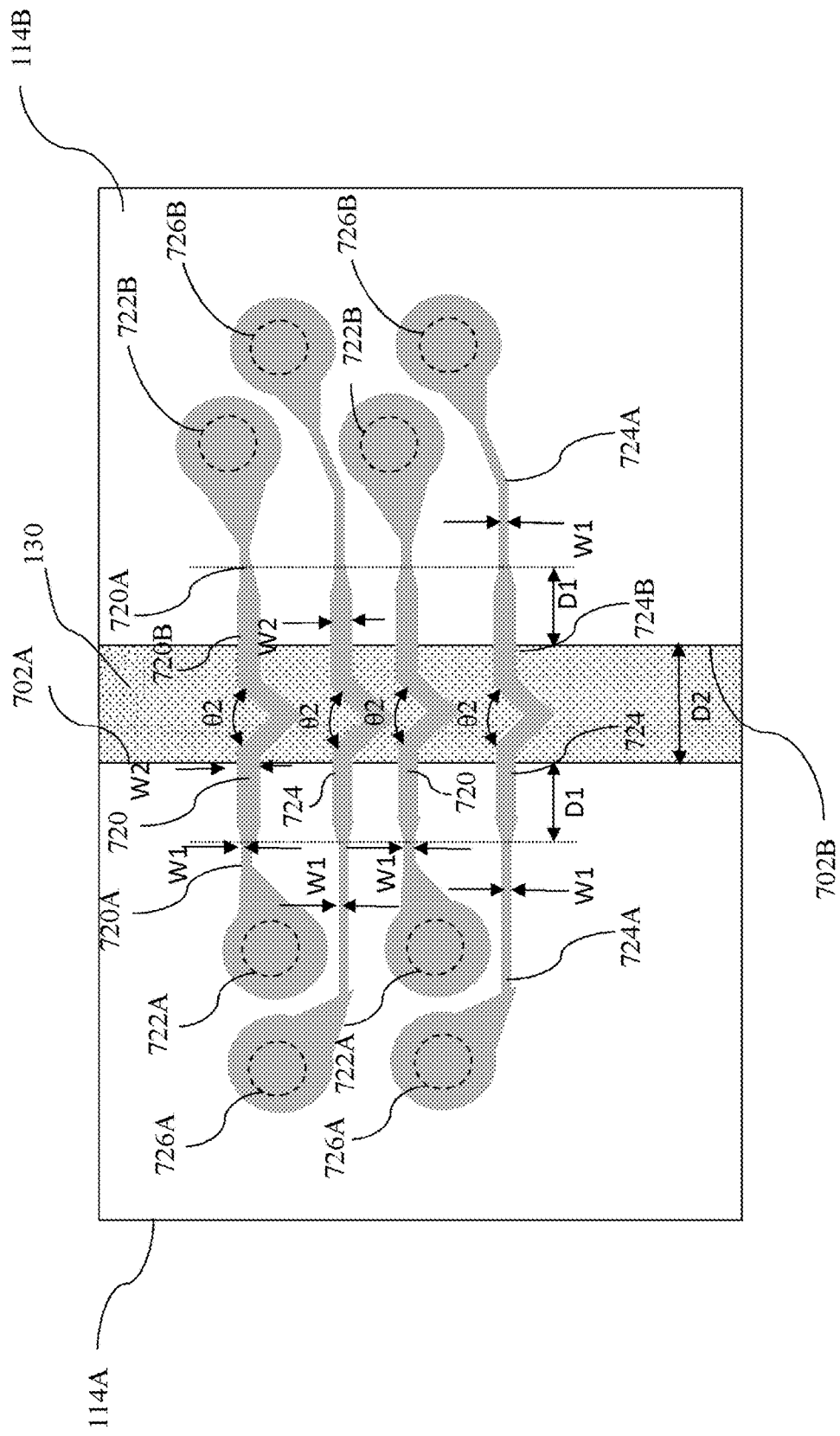

FIGS. 16, 17, and 18 illustrate simplified plan views of RDL routing in accordance with some embodiments. FIG. 16 illustrates a simplified plan view of one of the first package structures of FIG. 15. FIG. 16 illustrates two integrated circuit dies 114A and 114B encapsulated in the encapsulant 130. In an embodiment, a distance D2 between the two integrated circuit dies 114A and 114B may be about 50 µm to about 300 µm. In another embodiment, the distance D2 between the two integrated circuit dies 114A and 114B may be a different value. A first boundary 702A is shared between the first integrated circuit die 114A and the encapsulant 130, and a second boundary 702B is shared between the second integrated circuit die 114B and the encapsulant 130.

As illustrated by FIG. 16, the conductive lines 704 and 708 extend over the boundaries 702A and 702B between the integrated circuit dies 114A and 114B and the encapsulant 130. Conductive lines 704 and 708 may electrically and mechanically connect conductive vias 706A and 710A over the integrated circuit die 114A to conductive vias 706B and 710B in and/or over the integrated circuit die 114B. As discussed above, due to CTE mismatch between the materials of the integrated circuit dies 114A and 114B and the encapsulant 130, curvatures of the device package may occur at the boundaries 702A and 702B, which applies stress to the conductive lines 704 and 708 at the location of the boundaries 702A and 702B. It has been observed that this stress to the conductive lines 704 and 708 may be mitigated by making the conductive lines 704 and 708 wider over the encapsulant 130 and over the integrated circuit dies 114A and 114B near the boundaries 702A and 702B.

Two configurations of conductive lines are shown in conductive lines 704 and 708 of the overlying metallization patterns 154/146/138 (RDL patterns). The conductive line 704 is shorter with pads/vias nearer to the boundaries 702A and 702B and the conductive lines 708 are longer with pads/vias further from the boundaries 702A and 702B. This allows for the pads/vias of adjacent conductive lines 704 and 708 to be more tightly packed together. Conductive vias 706A, 706B, 710A and 710B (e.g., die connectors 126, through vias 112, and/or vias of the metallization patterns 154/146/138) are also illustrated in ghost for reference. Dielectric layers 132, 140, 148, and 156 are not shown. Various features of the plan view illustrated by FIG. 16 are illustrated in a single layer for simplicity only. In various embodiments, features in FIG. 16 may be disposed in different layers according to the cross-sectional view of FIG. 15. Furthermore, the conductive lines 704 and 708 may be disposed in a same metallization pattern or in different metallization patterns within a package. For example, the conductive line 704 may be disposed within a same layer, above, or below the conductive line 708.

Each of the conductive lines 704 and 708 include at least one wider portion 704B and 708B, respectively, disposed over the encapsulant 130 and over integrated circuit dies 114A and 114B within a first distance D1 of the boundaries 702A and 702B, respectively. Each of the conductive lines 704 and 708 may include narrower portions 704A and 708A, which is narrower than the wider portions, over the integrated circuit dies 114A and 114B outside of the first distance D1. In some embodiments, the wider portions 704B and 708B have a width W2 greater than or equal to about 5 µm. In some embodiments, the narrower portions 704A and 708A have a width W1 less than or equal to about 2 µm. In some embodiments, the first distance D1 is greater than or equal to about 10 µm. In other embodiments, the widths W1 and W2 and the first distance of may be different values with the width W2 being greater than the width W1. The widths of the portions/segments described above are measured in a direction perpendicular to a longitudinal axis of the portion/segment. It has been observed that by configuring conductive lines in accordance with the CTE mismatch between the integrated circuit dies 114A and/or 114B and the encapsulant 130 in the manner described herein, stress to conductive lines extending over a die/molding compound boundary can be reduced significantly. By reducing stress applied to the conductive lines, cracking and/or other manufacturing defects in the metallization patterns of a RDL can be reduced. Further, by having the narrow portions 704A and 704B in the pad/via regions, the routing penalty of having the wider conductive lines is insignificant.

FIG. 17 illustrates a simplified plan view of RDL routing similar to that of FIG. 16 except that the wider portions of the conductive lines include obtuse angle bends. In FIG. 17, the conductive line 712 and vias 714A and 714B are similar to the conductive lines 704 and vias 706A and 706B of FIG. 16 except for the obtuse bends in the wider portion 712B and the descriptions are not repeated herein. In FIG. 17, the conductive line 716 and vias 718A and 718B are similar to the conductive lines 708 and vias 710A and 710B of FIG. 16 except for the obtuse angle bends in the wider portion 716B and the descriptions are not repeated herein.

The obtuse angle bends in the wider portions 712B and 716B of the conductive lines 712 and 716 have bends of an angle θ1. In some embodiments, the angle θ1 can be greater than 90° and less than 180° as measured between respective segments of the wider portions 712B and/or 716B. Furthermore, the conductive lines and the angle between the conductive line segments and the boundaries 702A and 702B is purely illustrative, and the conductive line segments may be disposed at an angle across the boundaries 702A and 702B.

FIG. 18 illustrates a simplified plan view of RDL routing similar to that of FIG. 16 except that the wider portions of the conductive lines include acute angle bends. In FIG. 18, the conductive line 720 and vias 722A and 722B are similar to the conductive lines 704 and vias 706A and 706B of FIG. 16 except for the acute bends in the wider portion 720B and the descriptions are not repeated herein. In FIG. 18, the conductive line 724 and vias 726A and 726B are similar to the conductive lines 708 and vias 710A and 710B of FIG. 16 except for the acute angle bends in the wider portion 724B and the descriptions are not repeated herein.

The acute angle bends in the wider portions 720B and 724B of the conductive lines 720 and 724 have bends of an angle θ2. In some embodiments, the angle θ2 can be less than 90° and greater than 0° as measured between respective segments of the wider portions 720B and/or 724B. Furthermore, the conductive lines and the angle between the conductive line segments and the boundaries 702A and 702B is purely illustrative, and the conductive line segments may be disposed at an angle across the boundaries 702A and 702B. In some embodiments, the angles between segments of the wider portions is a right angle, e.g. about 90°.

In FIGS. 16, 17, and 18, the conductive vias 706B, 710B, 714B, 718B, 722B, and 726B are disposed over or in the integrated circuit die 114B. In other embodiments, the conductive vias 706B, 710B, 714B, 718B, 722B, and 726B may be disposed over or in the encapsulant 130 such that there is only one boundary 702 between the integrated circuit die 114A and the encapsulant 130.

In some embodiments, the above-described RDL routing design techniques are applied only to the first metallization pattern (e.g., metallization pattern 138) overlying the integrated circuit die 114 and the encapsulant 130 with the remaining metallization patterns being routed without regard to the configurations described in FIGS. 16 and 17. In some other embodiments, the above-described RDL routing design techniques are applied to all of the metallization patterns overlying the integrated circuit die 114 and the encapsulant 130 (e.g., metallization pattern 138, 146, and 154).

FIGS. 19 through 24 illustrate cross-sectional views of intermediate steps during a process for further forming a first package and for attaching other package structures to the first package in accordance with some embodiments.

Figure 19:
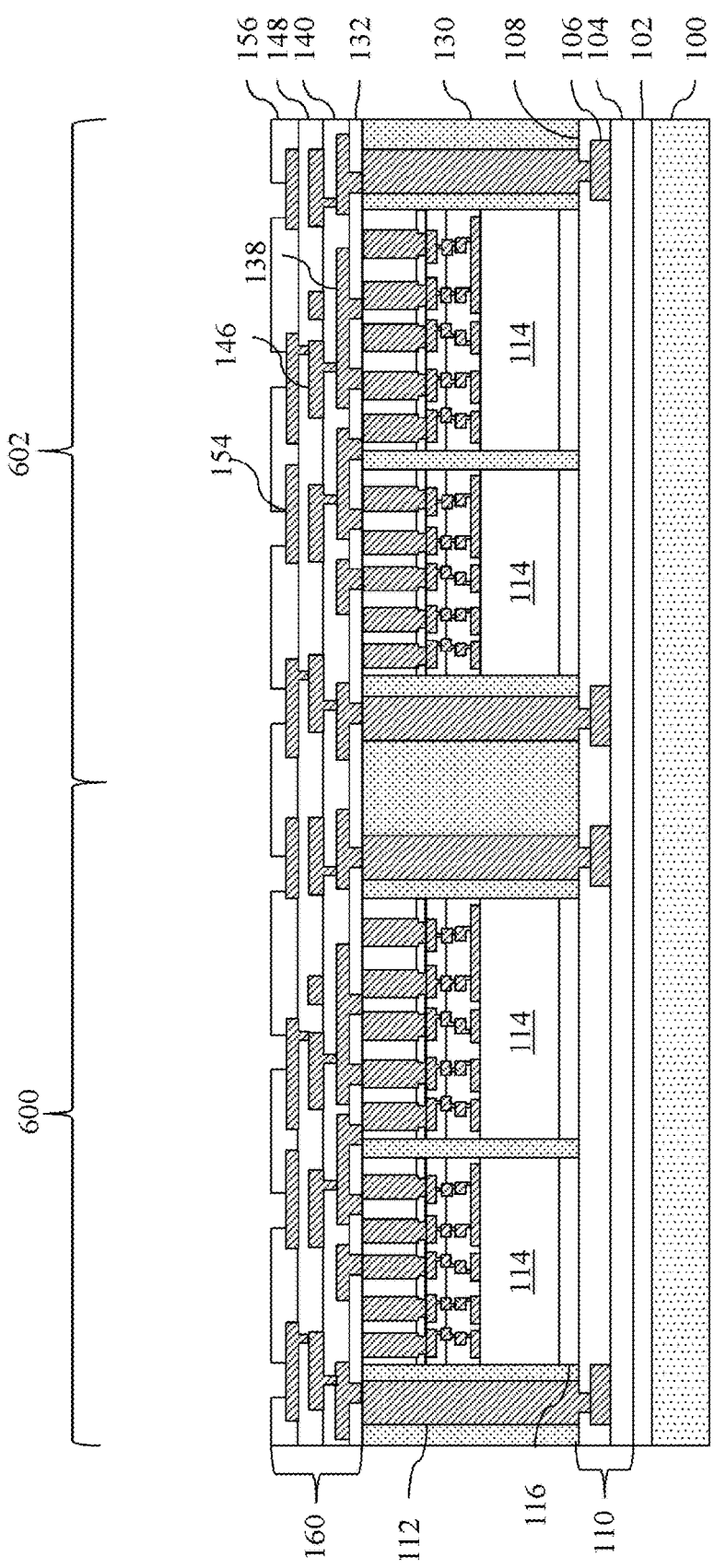
FIGS. 19 through 24 illustrate cross-sectional views of intermediate steps during a process for further forming the first package and for attaching other package structures to the first package in accordance with some embodiments.

In FIG. 19, the dielectric layer 156 is then patterned. The patterning forms openings to expose portions of the metallization pattern 154. The patterning may be by an acceptable process, such as by exposing the dielectric layer 156 to light when the dielectric layer is a photo-sensitive material or by etching using, for example, an anisotropic etch. If the dielectric layer 156 is a photo-sensitive material, the dielectric layer 156 can be developed after the exposure.

The front-side redistribution structure 160 is shown as an example. More or fewer dielectric layers and metallization patterns may be formed in the front-side redistribution structure 160. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Although the RDL routing design described herein is discussed with respect to the front-side redistribution structure 160, the teachings of the RDL routing process may also be applied to the back-side redistribution structure 110.

Figure 20:
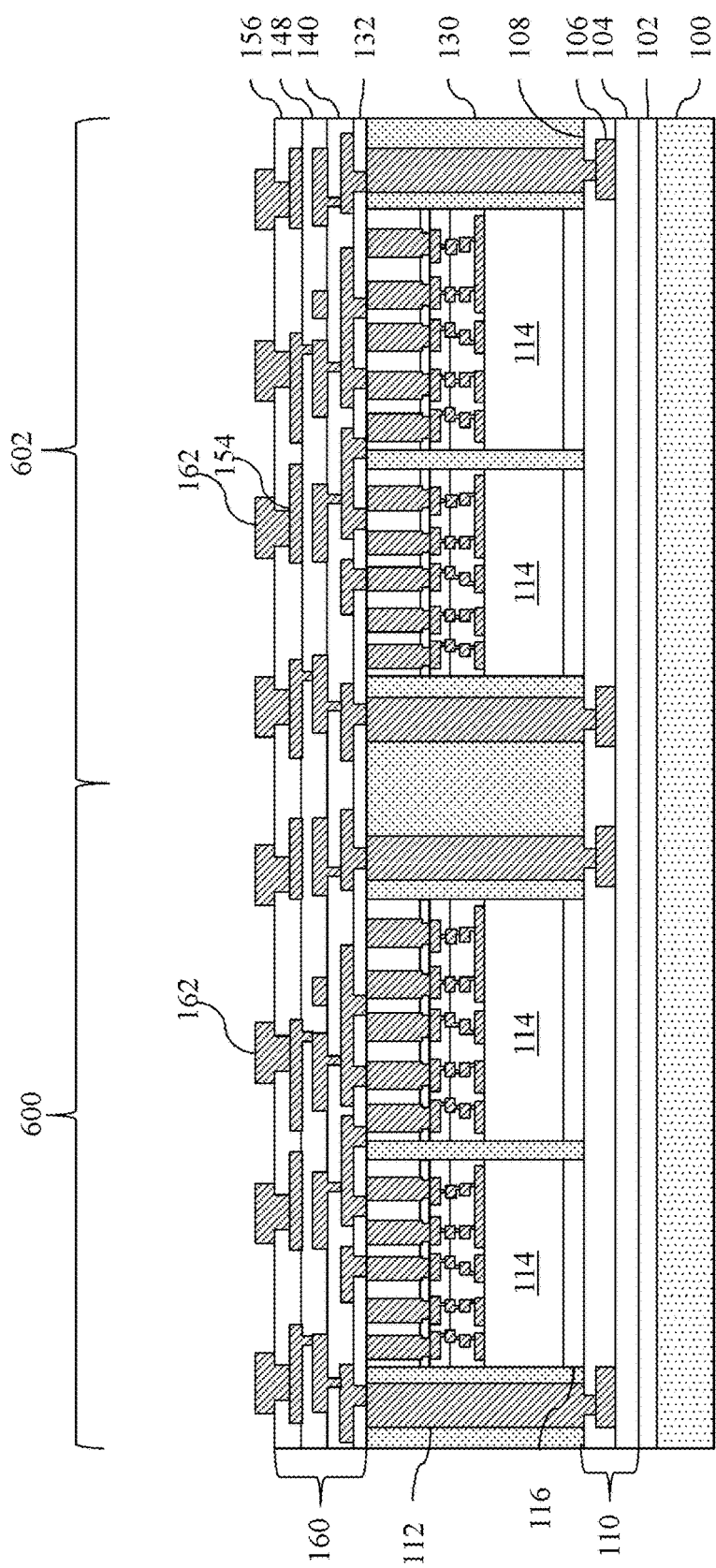

In FIG. 20, pads 162 are formed on an exterior side of the front-side redistribution structure 160. The pads 162 are used to couple to conductive connectors 166 (see FIG. 21) and may be referred to as under bump metallurgies (UBMs) 162. In the illustrated embodiment, the pads 162 are formed through openings through the dielectric layer 156 to the metallization pattern 154. As an example to form the pads 162, a seed layer (not shown) is formed over the dielectric layer 156. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 162. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 162. In the embodiment, where the pads 162 are formed differently, more photo resist and patterning steps may be utilized.

Figure 21:
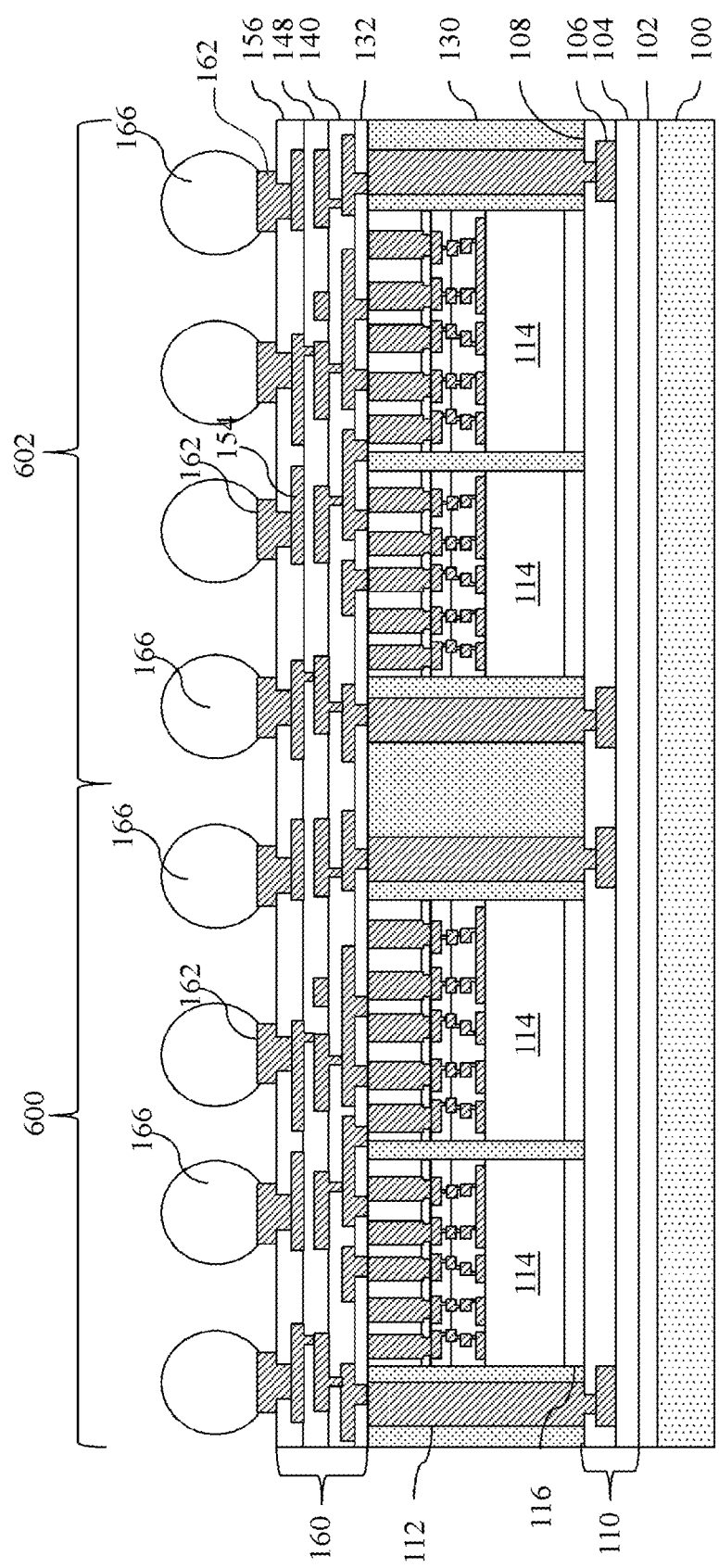

In FIG. 21, conductive connectors 166 are formed on the UBMs 162. The conductive connectors 166 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 166 may include a conductive material such as solder, copper, aluminum, gold, nickel, silver, palladium, tin, the like, or a combination thereof. In some embodiments, the conductive connectors 166 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 166 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 166. The metal cap layer may include nickel, tin, tin-lead, gold, silver, palladium, indium, nickel-palladium-gold, nickel-gold, the like, or a combination thereof and may be formed by a plating process.

Figure 22:
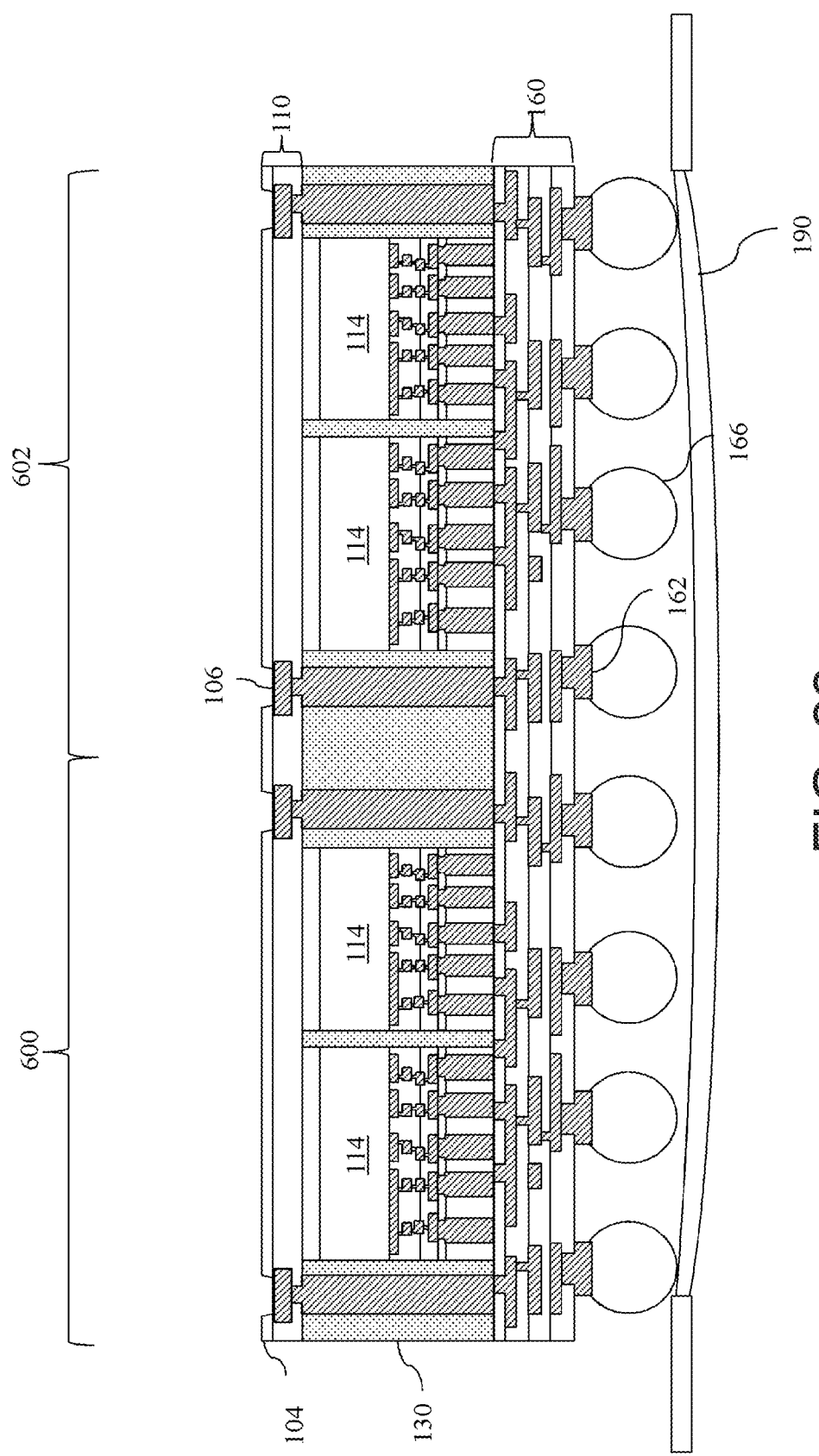

In FIG. 22, a carrier substrate de-bonding is performed to detach (de-bond) the carrier substrate 100 from the back-side redistribution structure, e.g., dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 190.

As further illustrated in FIG. 22, openings are formed through the dielectric layer 104 to expose portions of the metallization pattern 106. The openings may be formed, for example, using laser drilling, etching, or the like.

A singulation process is performed by sawing along scribe line regions e.g., between adjacent regions 600 and 602. The sawing singulates the first package region 600 from the second package region 602.

Figure 23:
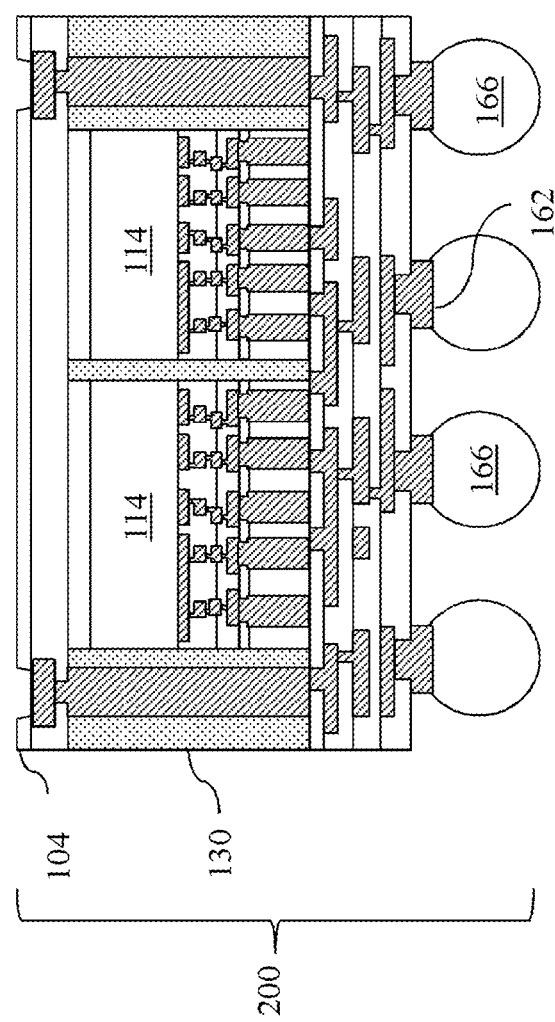

FIG. 23 illustrates a resulting, singulated package 200, which may be from one of the first package region 600 or the second package region 602. The package 200 may also be referred to as an integrated fan-out (InFO) package 200.

Figure 24:
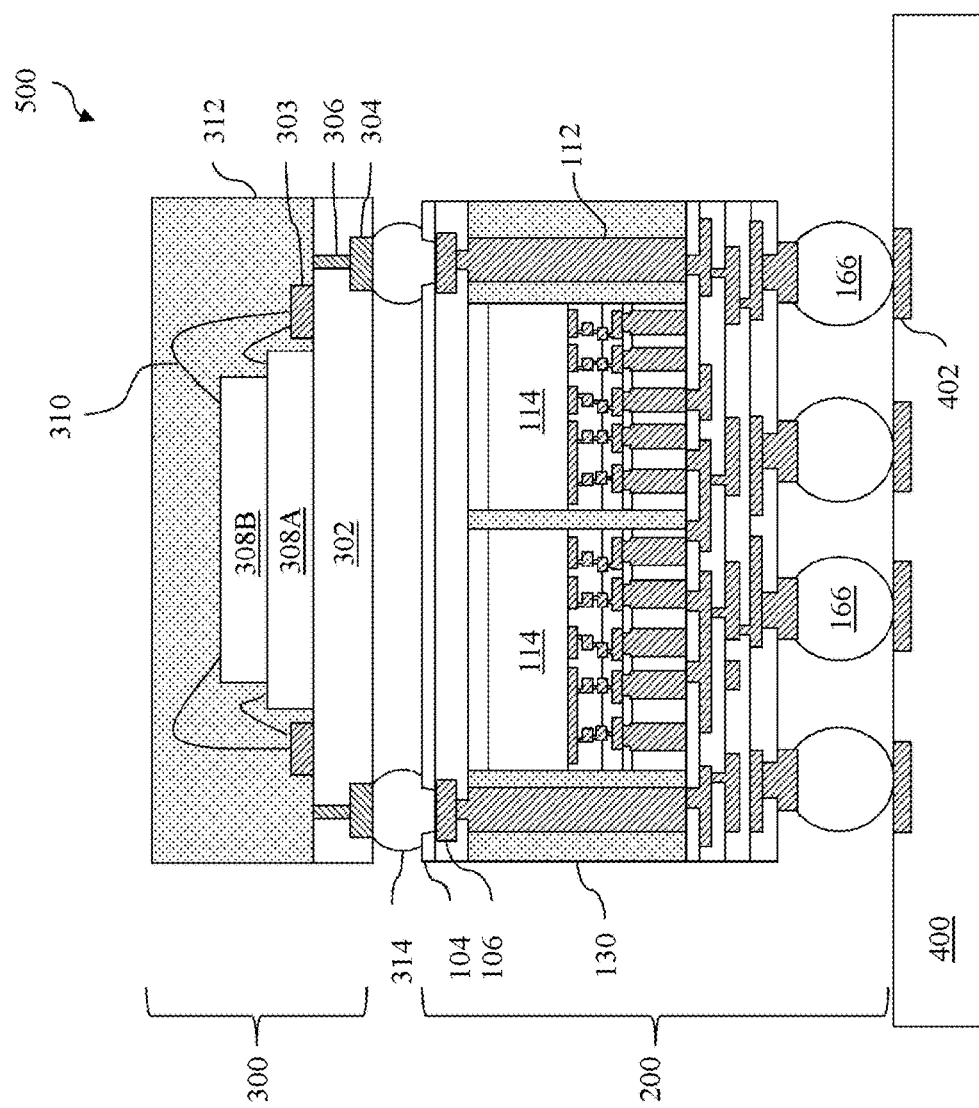

FIG. 24 illustrates a package structure 500 including the package 200 (may be referred to as a first package 200), a second package 300, and a substrate 400. The second package 300 includes a substrate 302 and one or more stacked dies 308 (308A and 308B) coupled to the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown in FIG. 24). As one of ordinary skill in the art will recognize, a wide variety of devices such as transistors, capacitors, resistors, combinations of these, and the like may be used to generate the structural and functional requirements of the design for the semiconductor package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 302 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electrochemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium-tungsten/copper, or an arrangement of copper/nickel/gold, that are suitable for the formation of the UBMs 303 and 304. Any suitable materials or layers of material that may be used for the UBMs 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked memory dies 308 may include low-power (LP) double data rate (DDR) memory modules, such as LPDDR1, LPDDR2, LPDDR3, LPDDR4, or the like memory modules.

In some embodiments, the stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second packages 300.

After the second packages 300 are formed, the packages 300 are bonded to the first packages 200 by way of conductive connectors 314, the bond pads 304, and the metallization pattern 106. In some embodiments, the stacked memory dies 308 may be coupled to the integrated circuit dies 114 through the wire bonds 310, the bond pads 303 and 304, through vias 306, the conductive connectors 314, and the through vias 112.

The conductive connectors 314 may be similar to the conductive connectors 166 described above and the description is not repeated herein, although the conductive connectors 314 and 166 need not be the same. In some embodiments, before bonding the conductive connectors 314, the conductive connectors 314 are coated with a flux (not shown), such as a no-clean flux. The conductive connectors 314 may be dipped in the flux or the flux may be jetted onto the conductive connectors 314. In another embodiment, the flux may be applied to the surfaces of the metallization patterns 106.

In some embodiments, the conductive connectors 314 may have an epoxy flux (not shown) formed thereon before they are reflowed with at least some of the epoxy portion of the epoxy flux remaining after the second package 300 is attached to the first package 200. This remaining epoxy portion may act as an underfill to reduce stress and protect the joints resulting from the reflowing the conductive connectors 314. In some embodiments, an underfill (not shown) may be formed between the second package 300 and the first package 200 and surrounding the conductive connectors 314. The underfill may be formed by a capillary flow process after the second package 300 is attached or may be formed by a suitable deposition method before the second package 300 is attached.

The bonding between the second package 300 and the first package 200 may be a solder bonding or a direct metal-to-metal (such as a copper-to-copper or tin-to-tin) bonding. In an embodiment, the second package 300 is bonded to the first package 200 by a reflow process. During this reflow process, the conductive connectors 314 are in contact with the bond pads 304 and the metallization patterns 106 to physically and electrically couple the second package 300 to the first package 200. After the bonding process, an IMC (not shown) may form at the interface of the metallization patterns 106 and the conductive connectors 314 and also at the interface between the conductive connectors 314 and the bond pads 304 (not shown).

The semiconductor package 500 includes the packages 200 and 300 being mounted to a substrate 400. The substrate 400 may be referred to a package substrate 400. The package 200 is mounted to the package substrate 400 using the conductive connectors 166.

The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown in FIG. 24). As one of ordinary skill in the art will recognize, a wide variety of devices such as transistors, capacitors, resistors, combinations of these, and the like may be used to generate the structural and functional requirements of the design for the semiconductor package 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 166 can be reflowed to attach the package 200 to the bond pads 402. The conductive connectors 166 electrically and/or physically couple the substrate 400, including metallization layers in the substrate 400, to the first package 200.

The conductive connectors 166 may have an epoxy flux (not shown) formed thereon before they are reflowed with at least some of the epoxy portion of the epoxy flux remaining after the package 200 is attached to the substrate 400. This remaining epoxy portion may act as an underfill to reduce stress and protect the joints resulting from the reflowing the conductive connectors 166. In some embodiments, an underfill (not shown) may be formed between the first package 200 and the substrate 400 and surrounding the conductive connectors 166. The underfill may be formed by a capillary flow process after the package 200 is attached or may be formed by a suitable deposition method before the package 200 is attached.

Embodiments of the device and methods in the current disclosure have many advantages. In particular, a redistribution layer (RDL) routing design that enables more reliability robustness at a semiconductor-encapsulant boundary (e.g. a silicon/molding compound (Si/MC) boundary). For example, heating a package up in wafer form from room temperature to 220° C. results in high bending stresses on the RDL at the semiconductor-encapsulant boundary due to the curvature changing drastically because of CTE mismatch. The stress of transferring from fan-in to fan-out area can cause the RDL cracking, at the die corner and die sides. Hence, in some embodiments, the RDL routing design (see FIGS. 16, 17, and 18) can be used for reliability robustness.

An embodiment is a structure including a first integrated circuit die, an encapsulant around the first integrated circuit die, a conductive line electrically connecting a first conductive via to a second conductive via, the conductive line including a first segment over the first integrated circuit die and having a first width, and a second segment over the first integrated circuit die having a second width larger than the first width, the second segment extending over a first boundary between the first integrated circuit die and the encapsulant.

Another embodiment is a method including encapsulating a first integrated circuit die in an encapsulant, forming redistribution layers (RDLs) over the first integrated circuit die and the encapsulant, wherein the RDLs comprise, a first conductive via over the first integrated circuit die, and a conductive line electrically connecting the first conductive via to a second conductive via, the conductive line including a first segment over the first integrated circuit die and having a first width, and a second segment extending over a boundary between the first integrated circuit die and the encapsulant, the second segment having a second width larger than the first width.

A further embodiment is a method including forming a first package including forming an electrical connector over a carrier substrate, attaching a first die and a second die to the carrier substrate, the electrical connector extending from a back side of the first die to an active side of the first die, the active side being opposite the back side, the electrical connector being adjacent the first die and the second die, encapsulating the first die and the electrical connector with a molding compound, and forming a redistribution structure overlying active sides of the first die and the second die and the molding compound, the forming the redistribution structure including forming a first conductive via over the active side of the first die, forming a second conductive via over the active side of the second die, and forming a conductive line electrically connecting the first conductive via to the second conductive via, the conductive line comprising a first segment, a second segment, and a third segment, the first segment being over the first die and having a first width, the second segment extending over a first boundary between the first die and the molding compound and over a second boundary between the second die and the molding compound, the second segment having a second width larger than the first width, the third segment being over the second die and having a third width smaller than the second width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
encapsulating a first integrated circuit die in an encapsulant;
forming redistribution layers (RDLs) over the first integrated circuit die and the encapsulant, wherein the RDLs comprise:
a first conductive via over the first integrated circuit die; and
a conductive line electrically connecting the first conductive via to a second conductive via, the conductive line comprising:
a first segment over the first integrated circuit die and having a first width; and
a second segment extending over a first boundary between the first integrated circuit die and the encapsulant and a second boundary between a second integrated circuit die and the encapsulant, the second segment having a second width along an entire length of the second segment between the first and second boundaries, the second width being larger than the first width.
2. The method of claim 1, wherein the second conductive via is disposed over the encapsulant.
3. The method of claim 1, wherein the second conductive via is disposed over a second integrated circuit die.

4. The method of claim 1, wherein the second segment includes a first bend, the first bend having a first angle.

5. The method of claim 4, wherein the first angle is greater than about 90°.

6. The method of claim 4, wherein the first angle is less than about 90°.

7. The method of claim 4, wherein the first angle is about 90°.

8. A method comprising:
forming a first package comprising:
   forming an electrical connector over a carrier substrate;
   attaching a first die and a second die to the carrier substrate, the electrical connector extending from a back side of the first die to an active side of the first die, the active side being opposite the back side, the electrical connector being adjacent the first die and the second die;
   encapsulating the first die, the second die, and the electrical connector with a molding compound; and
   forming a redistribution structure overlying active sides of the first die and the second die and the molding compound, the forming the redistribution structure comprising:
      forming a first conductive via over the active side of the first die;
      forming a second conductive via over the active side of the second die; and
      forming a conductive line electrically connecting the first conductive via to the second conductive via, the conductive line comprising a first segment, a second segment, and a third segment, the first segment being over the first die and having a first width, the second segment extending over a first boundary between the first die and the molding compound and over a second boundary between the second die and the molding compound, the second segment having a second width larger than the first width, the third segment being over the second die and having a third width smaller than the second width, the second segment comprising a first bend, the first bend having a first angle, the second segment further comprises three sub-segments, a first sub-segment being over the first boundary, a second sub-segment being over the encapsulant, and a third sub-segment being over the second boundary, the first and third sub-segments being parallel with each other.

9. The method of claim 8, wherein forming the first package further comprises:
forming a first set of conductive connectors over and electrically coupled to the redistribution structure; and
removing the carrier substrate.

10. The method of claim 8 further comprising:
bonding a second package to the first package using a second set of conductive connectors, the second package being proximate the back sides of the first die and the second die.

11. The method of claim 8, wherein the first angle is greater than about 90°.

12. The method of claim 8, wherein the first angle is less than about 90°.

13. The method of claim 8, wherein the first angle is about 90°.

14. A method comprising:
encapsulating a first integrated circuit die and a second integrated circuit die in an encapsulant;
forming a first conductive via over the first integrated circuit die;
forming a second conductive via over the second integrated circuit die;
forming a conductive line over the first integrated circuit die, the encapsulant, and the second integrated circuit die, the conductive line electrically connecting the first conductive via to the second conductive via, the conductive line comprising:
   a first segment over the first integrated circuit die and having a first width;
   a second segment over the first integrated circuit die having a second width larger than the first width, the second segment extending over a first boundary between the first integrated circuit die and the encapsulant and a second boundary between the encapsulant and the second integrated circuit die, the second segment comprising a first bend, the first bend having a first angle, the first angle is greater than about 90°, the second segment further comprises three sub-segments, a first sub-segment being over the first boundary, a second sub-segment being over the encapsulant, and a third sub-segment being over the second boundary, the first and third sub-segments being parallel with each other; and
   a third segment over the second integrated circuit die and having a third width smaller than the second width, the second segment being disposed between the first segment and the third segment.

15. The method of claim 14, wherein the second segment of the conductive line has the second width from the first integrated circuit die to the second integrated circuit die.

16. The method of claim 14 further comprising:
before encapsulating the first integrated circuit die and the second integrated circuit die:
   forming a first electrical connector and a second electrical connector over a carrier substrate; and
   attaching the first integrated circuit die and the second integrated circuit die to the carrier substrate, the first and second electrical connectors extending from a back side of the first integrated circuit die to an active side of the first integrated circuit die, the active side being opposite the back side, the first and second electrical connectors being adjacent the first integrated circuit die and the second integrated circuit die.

17. The method of claim 16 further comprising:
forming a second conductive line over and electrically coupled to the conductive line;
forming a first set of conductive connectors over and electrically coupled to the second conductive line; and
removing the carrier substrate.

18. The method of claim 17 further comprising:
bonding a package structure to the first and second electrical connectors using a second set of conductive connectors, the package structure being proximate the back sides of the first integrated circuit die and the second integrated circuit die.

19. The method of claim 1 further comprising:
before encapsulating the first integrated circuit die:
   forming a first electrical connector and a second electrical connector over a carrier substrate; and
   attaching the first integrated circuit die to the carrier substrate, the first and second electrical connectors extending from a back side of the first integrated circuit die to an active side of the first integrated circuit die, the active side being opposite the back side, the first and second electrical connectors being adjacent the first integrated circuit die.

\* \* \* \* \*